United States Patent
Kakehata et al.

(10) Patent No.: US 8,390,067 B2
(45) Date of Patent: Mar. 5, 2013

(54) SUBSTRATE FOR MANUFACTURING SEMICONDUCTOR DEVICE AND MANUFACTURING METHOD THEREOF

(75) Inventors: Tetsuya Kakehata, Isehara (JP); Kazutaka Kuriki, Ebina (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/008,241

(22) Filed: Jan. 18, 2011

(65) Prior Publication Data

US 2011/0115045 A1 May 19, 2011

Related U.S. Application Data

(62) Division of application No. 12/155,340, filed on Jun. 3, 2008, now Pat. No. 7,875,532.

(30) Foreign Application Priority Data

Jun. 15, 2007 (JP) ................................. 2007-158286

(51) Int. Cl.
*H01L 27/12* (2006.01)
(52) U.S. Cl. ....................................................... 257/347
(58) Field of Classification Search .................... 257/347
See application file for complete search history.

(56) References Cited

U.S. PATENT DOCUMENTS

| | | | |
|---|---|---|---|
| 5,313,075 A | 5/1994 | Zhang et al. | |
| 5,374,564 A | 12/1994 | Bruel | |
| 5,523,240 A | 6/1996 | Zhang et al. | |
| 6,127,702 A | 10/2000 | Yamazaki et al. | |
| 6,245,645 B1 * | 6/2001 | Mitani et al. | 438/455 |
| 6,271,101 B1 | 8/2001 | Fukunaga | |
| 6,335,231 B1 | 1/2002 | Yamazaki et al. | |

(Continued)

FOREIGN PATENT DOCUMENTS

| | | |
|---|---|---|
| EP | 1 045 448 | 10/2000 |
| JP | 11-163363 | 6/1999 |

(Continued)

OTHER PUBLICATIONS

Aviza Technology "Turning the heat down" www.eurosemi.eu.com Feb. 2005 pp. 1-2 available online at http://www.airliquide.de/inc/dokument.php/standard/283/LowTSiN_Deposition.pdf as of Dec. 8, 2011.*

(Continued)

*Primary Examiner* — N Drew Richards
*Assistant Examiner* — Grant Withers
(74) *Attorney, Agent, or Firm* — Eric J. Robinson; Robinson Intellectual Property Law Office, P.C.

(57) ABSTRACT

A substrate with which a semiconductor device with excellent electric characteristics and high reliability can be manufactured is provided. An aspect of the invention is a method for manufacturing a substrate for manufacturing a semiconductor device: a first silicon oxide film, a silicon nitride film, and a second silicon oxide film are stacked in this order over a surface of a semiconductor substrate by a thermal CVD method, and then a weakened layer is formed at a given depth of the semiconductor substrate; the semiconductor substrate and a substrate having an insulating surface are arranged to face each other, and the second silicon oxide film provided for the semiconductor substrate and a supporting substrate are bonded to each other; and the semiconductor substrate is separated at the weakened layer by heat treatment, whereby a semiconductor film separated from the semiconductor substrate is left over the substrate having the insulating surface.

21 Claims, 16 Drawing Sheets

U.S. PATENT DOCUMENTS

| | | |
|---|---|---|
| 6,372,609 B1 | 4/2002 | Aga et al. |
| 6,380,046 B1 | 4/2002 | Yamazaki |
| 6,388,652 B1 | 5/2002 | Yamazaki et al. |
| 6,602,761 B2 | 8/2003 | Fukunaga |
| 6,686,623 B2 | 2/2004 | Yamazaki |
| 6,778,164 B2 | 8/2004 | Yamazaki et al. |
| 6,803,264 B2 | 10/2004 | Yamazaki et al. |
| 6,875,633 B2 | 4/2005 | Fukunaga |
| 6,927,148 B2 | 8/2005 | Ito |
| 7,112,514 B2 | 9/2006 | Yasukawa |
| 7,176,525 B2 | 2/2007 | Fukunaga |
| 7,199,024 B2 | 4/2007 | Yamazaki |
| 7,256,776 B2 | 8/2007 | Yamazaki et al. |
| 7,473,971 B2 | 1/2009 | Yamazaki et al. |
| 7,476,576 B2 | 1/2009 | Yamazaki et al. |
| 7,535,053 B2 | 5/2009 | Yamazaki |
| 2005/0029594 A1* | 2/2005 | Joly et al. ............. 257/349 |
| 2006/0055003 A1* | 3/2006 | Tomita et al. .......... 257/629 |
| 2007/0108510 A1 | 5/2007 | Fukunaga |
| 2007/0173000 A1 | 7/2007 | Yamazaki |
| 2007/0291022 A1 | 12/2007 | Yamazaki et al. |
| 2009/0093103 A1 | 4/2009 | Henley et al. |
| 2009/0179253 A1* | 7/2009 | Levy et al. ............. 257/324 |

FOREIGN PATENT DOCUMENTS

JP    2000-124092    4/2000

OTHER PUBLICATIONS

Oh, "Floating Body DRAM Characteristics of Silicon-On-ONO (SOONO) Devices for System-on-Chip (SoC) Applications," 2007 Symposium on VLSI Technology Digest of Technical Papers, Jul. 14, 2007, pp. 168-169.

Oh, "Si-On-ONO (SOONO) Devices Realized on Bulk Si Wafers for Fully-Depleted SOI Transistor and 4-Bit Flash Memory Applications," Solid-State and Integrated Circuit Technology, Oct. 26, 2006, pp. 769-771.

Oh, "A Novel Multi-Functional Silicon-On-ONO (SOONO) MOSFETs for SoC applications: Electrical Characterization for High Performance Transistor and Embeded Memory Applications," 2006 Symposium on VLSI Technology Digest of Technical Papers, Oct. 2, 2006, pp. 48-49.

* cited by examiner

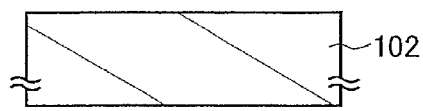
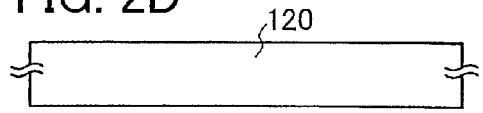
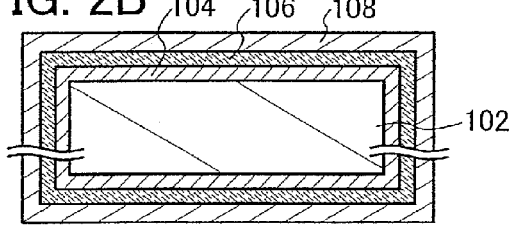
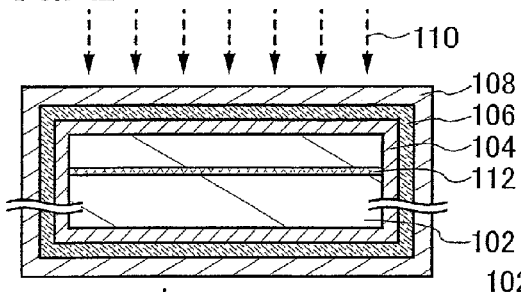
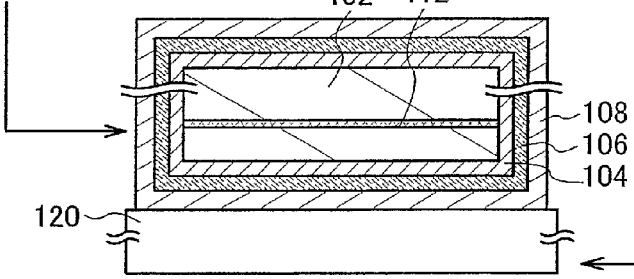
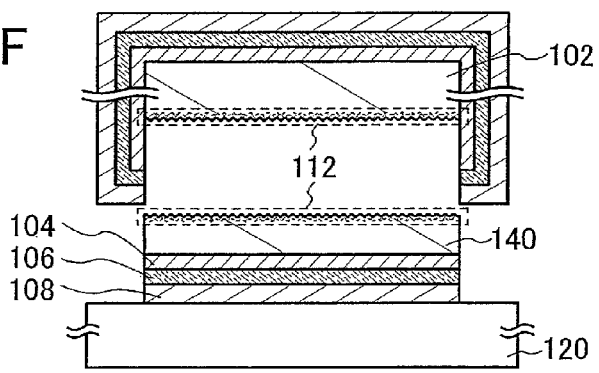
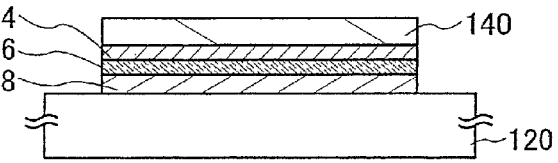

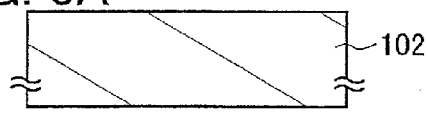
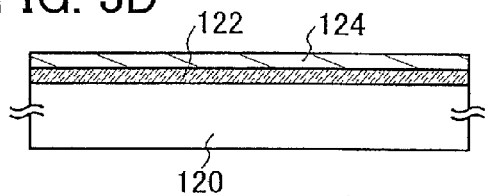
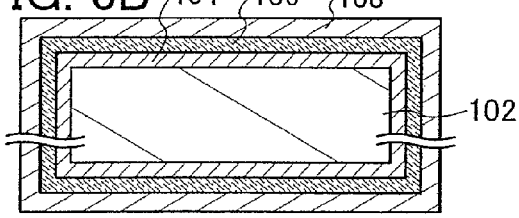
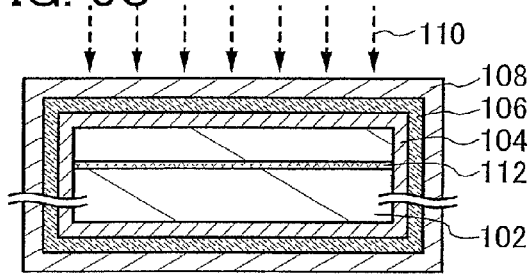
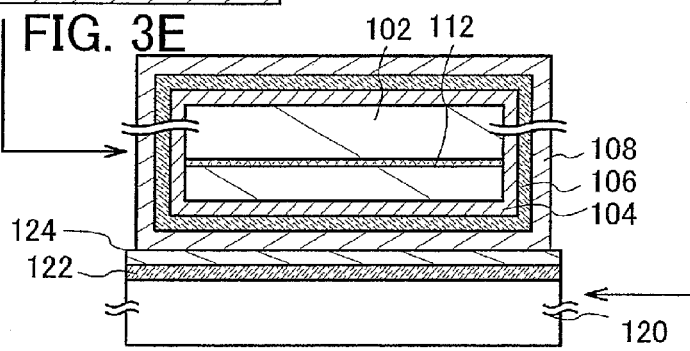
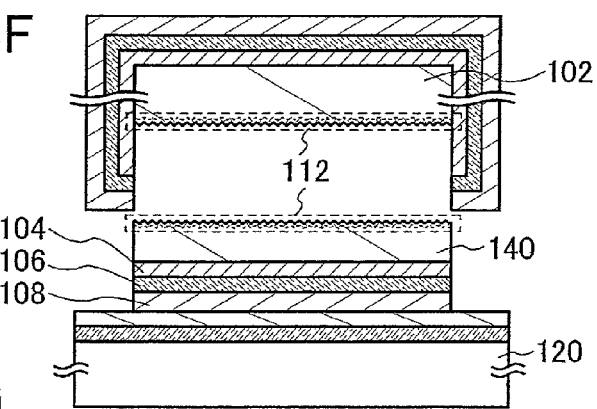
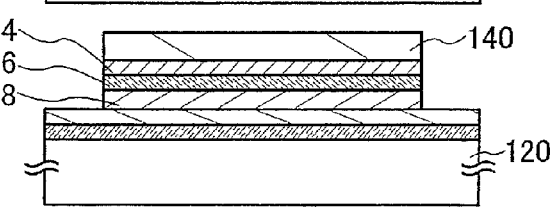

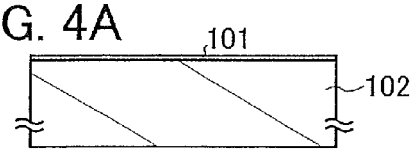
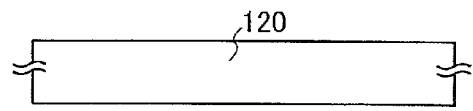
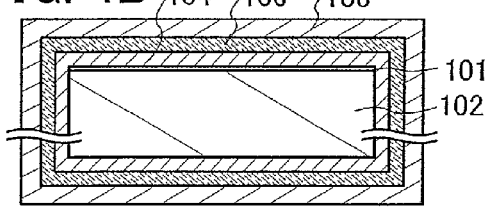
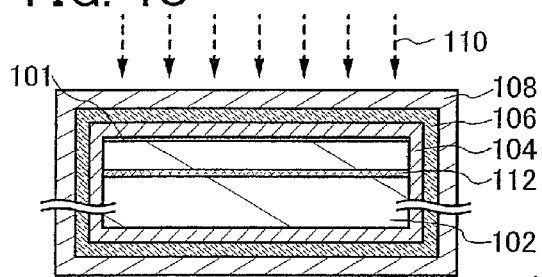
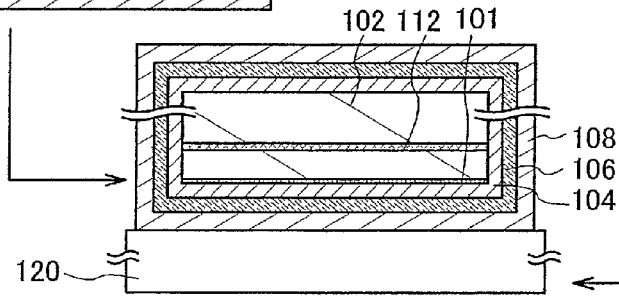
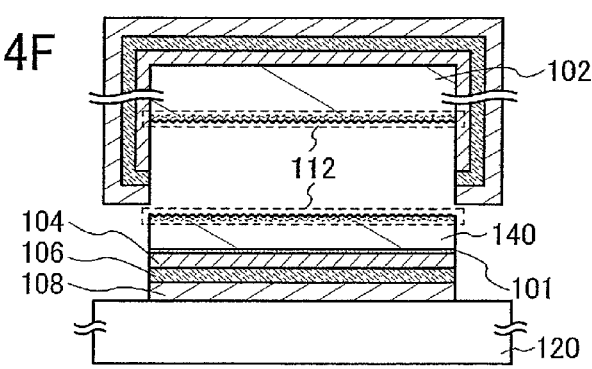
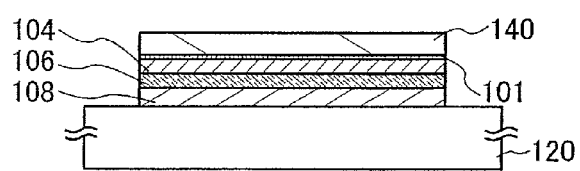

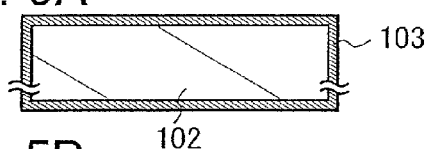
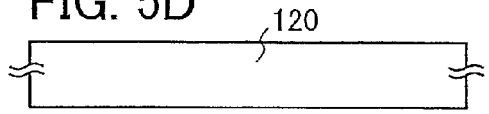
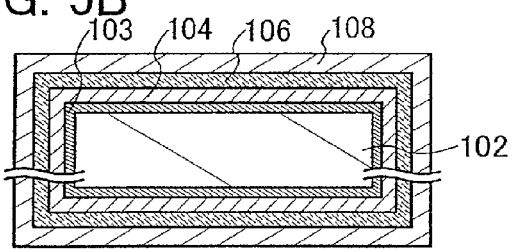
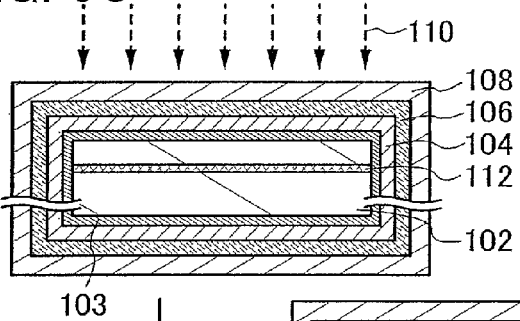
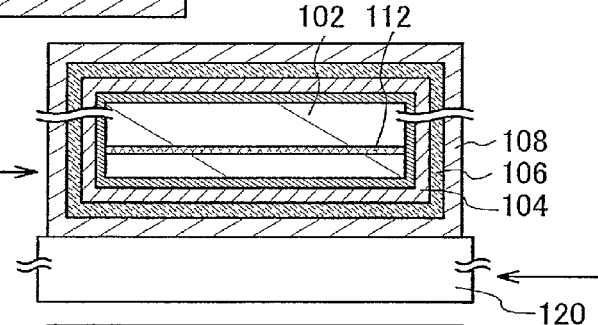
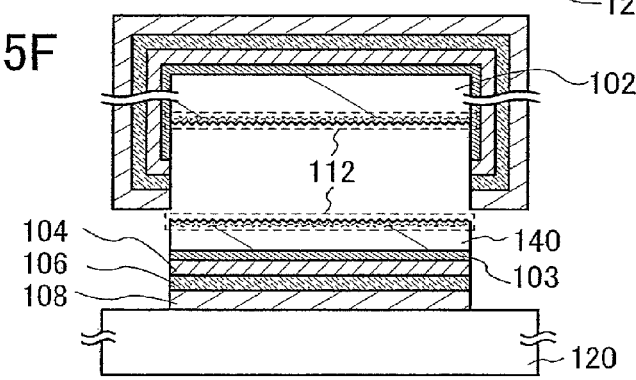
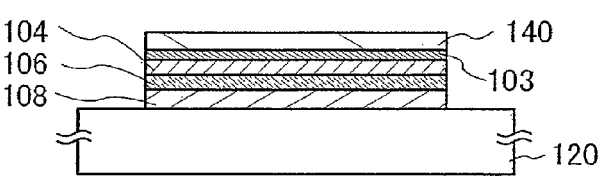

SUBSTRATE FOR MANUFACTURING SEMICONDUCTOR DEVICE AND MANUFACTURING METHOD THEREOF

BACKGROUND OF THE INVENTION

1. Field of the Invention

The present invention relates to a substrate for manufacturing a semiconductor device with an SOI (silicon on insulator) structure and to a manufacturing method thereof.

In this specification, a semiconductor device means a device in general which can operate utilizing semiconductor characteristics. An electrooptic device, a semiconductor circuit, and an electronic device are all included in the category of the semiconductor device.

2. Description of the Related Art

With development in VLSI technology, demanded levels of integration, operation speed, and power consumption have been higher. In order to satisfy these requirements, an SOI structure is receiving attention. In this technology, an active region (channel formation region) of a field-effect transistor (FET), which is conventionally formed with bulk single-crystalline silicon, is formed with a single-crystalline silicon thin film. It is known that use of the SOI structure enables manufacturing a MOS field-effect transistor with smaller parasitic capacitance than in the conventional case of using a bulk single-crystalline silicon substrate, and is advantageous to high speed operation.

As an SOI substrate, a SIMOX substrate or a bonded substrate is known. An SIMOX substrate is formed in the following manner: oxygen ions are implanted into a single-crystalline silicon substrate and heat treatment is performed at 1300° C. or higher to form a buried oxide layer, so that a single-crystalline silicon film is formed on the surface and thus an SOI structure is obtained. In the SIMOX substrate, oxygen ion implantation can be controlled precisely and thus a single-crystalline silicon film can be formed with an even thickness; however, oxygen ion implantation takes much time and there are problems in time and costs. Further, there is another problem in that a single-crystalline silicon substrate is damaged easily in the oxygen ion implantation, so that an obtained single-crystalline silicon film can be influenced.

A bonded substrate is formed in the following manner: two single-crystalline silicon substrates are bonded to each other with an insulating film interposed therebetween and one of the single-crystalline silicon substrates is thinned, so that a single-crystalline silicon film is formed to obtain an SOI structure. As a method for thinning a film, a hydrogen ion implanting separation method is known. In the hydrogen ion implanting separation method, hydrogen ions are implanted into one single-crystalline silicon substrate to form a microbubble layer at a given depth from a surface of the silicon substrate; the microbubble layer functioning as a cleavage plane, a single-crystalline film can be fixed to the other single-crystalline silicon substrate (see Reference 1: Japanese Published Patent Application No. 2000-124092).

In recent years, an attempt to form a single-crystalline silicon film over a substrate having an insulating surface, such as glass, has been made. As an example of an SOI substrate in which a single-crystalline silicon film is formed over a glass substrate, one devised by the present applicant is known (see Reference 2: Japanese Published Patent Application No. H11-163363).

SUMMARY OF THE INVENTION

In a case of forming a single-crystalline semiconductor film on a different kind of substrate from a semiconductor substrate, a problem can be caused due to impurities in the different kind of substrate. For example, in an SOI substrate in which a single-crystalline semiconductor film is formed on a glass substrate, metal impurities such as an alkali metal or an alkaline earth metal in the glass substrate are diffused into the single-crystalline semiconductor film through heat treatment, unfortunately. In a case of manufacturing a field-effect transistor using the single-crystalline semiconductor film, diffusion of metal impurities leads to characteristic degradation, and causes reduction in reliability.

In view of the above problem, it is an object of the present invention to provide a substrate for manufacturing a semiconductor device with improved electric characteristics, and a manufacturing method thereof. Further, it is another object to provide a semiconductor device with high reliability and a manufacturing method thereof.

A semiconductor film which is separated from a semiconductor substrate is transferred to a supporting substrate having an insulating surface, so that a substrate for manufacturing a semiconductor device is manufactured. A silicon oxide film, a silicon nitride film, and a silicon oxide film are formed in this order on a semiconductor substrate, from which a semiconductor film is obtained, and ions are implanted into the semiconductor substrate to form an ion implantation layer in a region at a given depth. The semiconductor substrate and the supporting substrate are superposed to be bonded to each other with stacked layers of the silicon oxide film, the silicon nitride film, and the silicon oxide film interposed therebetween. The semiconductor substrate is separated at the ion implantation layer by heat treatment with the semiconductor film being left over the supporting substrate, whereby a substrate for manufacturing a semiconductor device is manufactured.

Note that "ion implantation" in this specification means that a semiconductor substrate is irradiated with ions accelerated by an electric field to introduce an element which constitutes the ions for irradiation into the semiconductor substrate. Further, an "ion implantation layer" in this specification is a region which is weakened by irradiating a semiconductor substrate with ions so as to have minute cavities, and is referred to as a "weakened layer," hereinafter. A semiconductor film can be formed over a supporting substrate by separating the semiconductor substrate at the weakened layer through later heat treatment.

An aspect of the present invention is a method for manufacturing a substrate for manufacturing a semiconductor device, including the steps of: stacking a first silicon oxide film, a silicon nitride film, and a second silicon oxide film in this order over a surface of a single-crystalline semiconductor substrate by a thermal CVD method; forming a weakened layer at a given depth of the single-crystalline semiconductor substrate; arranging the single-crystalline semiconductor substrate and a substrate having an insulating surface to face each other, and bonding the second silicon oxide film provided for the single-crystalline semiconductor substrate and the substrate having the insulating surface to each other; and separating the single-crystalline semiconductor substrate at the weakened layer by heat treatment, thereby leaving a single-crystalline semiconductor film separated from the single-crystalline semiconductor substrate, over the substrate having the insulating surface.

In the above structure, it is preferable that the first silicon oxide film, the silicon nitride film, and the second silicon oxide film be formed successively by a thermal CVD method. Further, it is preferable that the first silicon oxide film and the silicon nitride film be formed at film formation temperatures of 600° C. or higher.

The first silicon oxide film and the second silicon oxide film can be formed using a silane gas and a nitrogen oxide gas as source gases. As a silane gas, monosilane, disilane, or trisilane can be used, for example. As a nitrogen oxide gas, nitrous oxide or nitrogen dioxide can be used.

The silicon nitride film can be formed using a silane gas containing chlorine and a gas containing nitrogen and hydrogen as constituent elements as source gases. As a gas containing chlorine, dichlorosilane or trichlorosilane is used, for example. As a gas containing nitrogen and hydrogen as constituent elements, ammonia or hydrazine can be used.

Further, in the above structure, an oxide film can be formed on the single-crystalline semiconductor substrate at a surface by performing oxidation treatment in advance, and the first silicon oxide film, the silicon nitride film, and the second silicon oxide film can be stacked in this order over the oxide film on the surface of the single-crystalline the semiconductor substrate. As the oxidation treatment to the single-crystalline semiconductor substrate, heat treatment or plasma treatment in an atmosphere containing oxygen or UV ozone treatment can be employed.

Furthermore, in the above structure, it is preferable that the weakened layer be formed by irradiation with ions with different mass which each include one atom or a plurality of the same atoms. As the ions with different mass, it is preferable to use an $H^+$ ion, an $H_2^+$ ion, and/or an $H_3^+$ ion.

In this specification, "ions with different mass which each include one atom or a plurality of the same atoms" means ions of one optional atom A and ions which each include a plurality of the optional atoms A. Further, the "ions with different mass which each include one atom or a plurality of the same atoms" means ions which each include a plurality of optional atoms A and ions of one isotope A' of the optional atom A; for example, $H_2^+$ ions and $^2H^+$ ions (also referred to as $D^+$ ions) can be given.

Another aspect of the present invention is a substrate for manufacturing a semiconductor device which includes a single-crystalline semiconductor film fixed over a substrate having an insulating surface, and a first silicon oxide film, a silicon nitride film, and a second silicon oxide film which are stacked in this order between the substrate having the insulating surface and the single-crystalline semiconductor film; in which the silicon nitride film contains chlorine.

In the above structure, it is preferable that the silicon nitride film contains chlorine at a concentration of $1 \times 10^{17}$ to $1 \times 10^{21}$ atoms/cm$^3$ inclusive.

Further, in the above structure, the first silicon oxide film or the second silicon oxide film can be a silicon oxide film or a silicon oxynitride film. The silicon nitride film can be a silicon nitride film or a silicon nitride oxide film.

Furthermore, in the above structure, a glass substrate, a quartz substrate, a ceramic substrate, a sapphire substrate, or a metal substrate coated with an insulating film at a surface can be used for the substrate having the insulating surface.

Employment of a substrate for manufacturing a semiconductor device according to the present invention can improve electric characteristics in manufacturing a semiconductor device. Further, manufacture of a semiconductor device with improved reliability can be realized.

BRIEF DESCRIPTION OF DRAWINGS

In the accompanying drawings:

FIGS. 2A to 2G are diagrams showing an example of a manufacturing method of a substrate for manufacturing a semiconductor device;

FIGS. 3 to 3G are diagrams showing an example of a manufacturing method of a substrate for manufacturing a semiconductor device;

FIGS. 4A to 4G are diagrams showing an example of a manufacturing method of a substrate for manufacturing a semiconductor device;

FIGS. 5A to 5G are diagrams showing an example of a manufacturing method of a substrate for manufacturing a semiconductor device;

DETAILED DESCRIPTION OF THE INVENTION

Embodiment Modes

Figure 1:
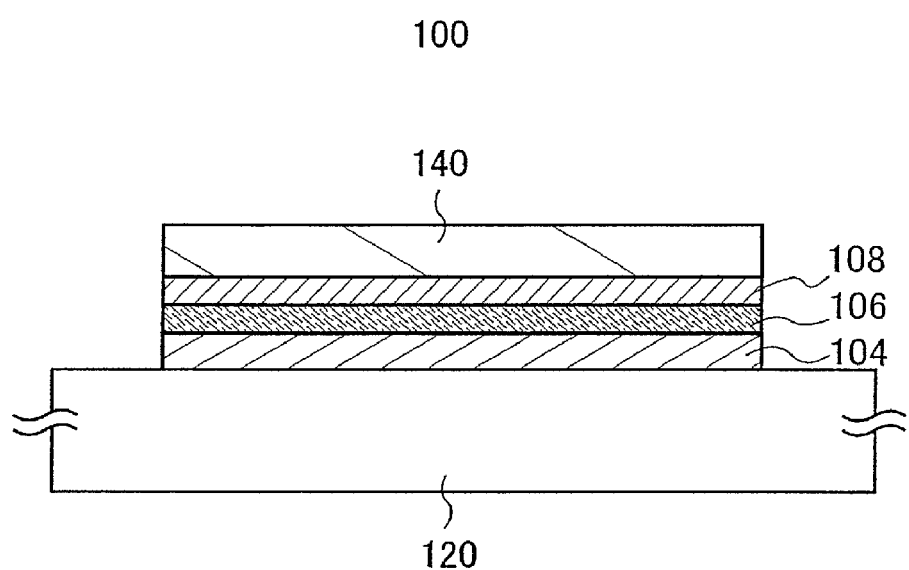
FIG. 1 is a diagram showing a structural example of a substrate for manufacturing a semiconductor device.

Hereinafter, embodiment modes of the present invention are described with reference to the drawings. Note that the present invention is not limited to the following description, and it is easily understood by those skilled in the art that the modes and details disclosed herein can be modified in various ways without departing from the spirit and scope of the present invention. Therefore, the present invention should not be interpreted as being limited to the description of the embodiment modes to be given below. In the structures of the present invention to be described hereinafter, a reference numeral which designates the same parts is used in different drawings in some cases.

Embodiment Mode 1

A substrate for manufacturing a semiconductor device of this embodiment mode has an SOI structure, and is formed by transferring a semiconductor film separated from a semiconductor substrate, preferably a single-crystalline semiconductor film separated from a single-crystalline semiconductor substrate, to a supporting substrate. As the supporting substrate, a substrate whose main component is different from that of the semiconductor substrate is used. FIG. 1 shows a mode of a substrate for manufacturing a semiconductor device of this embodiment mode.

In a substrate 100 for manufacturing a semiconductor device in FIG. 1, a stacked-layer structure of a first silicon oxide film 104, a silicon nitride film 106, and a second silicon oxide film 108 is formed on a supporting substrate 120, and a semiconductor film 140 is formed on the stacked-layer structure. The semiconductor film 140 is fixed over the supporting substrate 120 with the first silicon oxide film 104, the silicon nitride film 106, and the second silicon oxide film 108 interposed therebetween.

As the supporting substrate 120, a substrate having an insulating surface or an insulating substrate is used. Concretely, a variety of glass substrates for electronic industry (also called an "alkali-free glass substrate") such as an aluminosilicate glass substrate, an aluminoborosilicate glass substrate, or a barium borosilicate glass substrate, a quartz substrate, a ceramic substrate, a sapphire substrate, a metal substrate whose surface is covered with an insulating film, or the like can be given.

As the first silicon oxide film 104 or the second silicon oxide film 108, a silicon oxide film or a silicon oxynitride film is formed.

As the silicon nitride film 106, a silicon nitride film or a silicon nitride oxide film is formed. The silicon nitride film 106 contains chlorine in the film, preferably at a concentration of $1 \times 10^{17}$ to $1 \times 10^{21}$ atoms/cm$^3$ inclusive.

Note that a silicon oxynitride film in this specification means a film that contains more oxygen than nitrogen, and in the case where measurements are performed using Rutherford backscattering spectrometry (RBS) and hydrogen forward scattering (HFS), contains oxygen, nitrogen, silicon, and hydrogen at concentrations ranging from 50 to 70 atoms % inclusive, 0.5 to 15 atoms % inclusive, 25 to 35 atoms % inclusive, and 0.1 to 10 atoms % inclusive, respectively. Further, a silicon nitride oxide film means a film that contains more nitrogen than oxygen, and in the case where measurements are performed using RBS and HFS, contains oxygen, nitrogen, silicon, and hydrogen at concentrations ranging from 5 to 30 atoms % inclusive, 20 to 55 atoms % inclusive, 25 to 35 atoms % inclusive, and 10 to 30 atoms % inclusive, respectively. Note that percentages of nitrogen, oxygen, silicon, and hydrogen fall within the ranges given above, where the total number of atoms contained in the silicon nitride oxide film or the silicon oxynitride film is defined as 100 atoms %.

The semiconductor film 140 is formed using a single-crystalline semiconductor or a polycrystalline semiconductor. Concretely, a semiconductor film is formed using a single-crystalline or polycrystalline semiconductor of silicon, germanium, silicon germanium, or the like, or a compound semiconductor such as gallium arsenide or indium phosphide.

Hereinafter, an example of a specific manufacturing method is described with reference to the drawings. FIGS. 2A to 2G are cross-sectional diagrams showing a manufacturing method of a substrate for manufacturing a semiconductor device according to this embodiment mode.

A semiconductor substrate 102 is prepared (see FIG. 2A). As the semiconductor substrate 102, a semiconductor substrate such as a silicon substrate or a germanium substrate, or a compound semiconductor substrate such as a gallium arsenide substrate or an indium phosphide substrate is used. Although it is preferable to use a single-crystalline semiconductor substrate as the semiconductor substrate 102, it is also possible to use a polycrystalline semiconductor substrate. Further, a semiconductor substrate used may be rectangular or circular. In this mode, a single-crystalline silicon substrate is used as the semiconductor substrate 102.

The first silicon oxide film 104, the silicon nitride film 106, and the second silicon oxide film 108 are formed in this order on a surface of the cleaned semiconductor substrate 102 (see FIG. 2B). These stacked films are formed at least on a surface side where the semiconductor substrate 102 forms a bond with a supporting substrate.

The first silicon oxide film 104, the silicon nitride film 106, and the second silicon oxide film 108 are formed by a CVD (chemical vapor deposition) method. Examples of a CVD method include a thermal CVD method, a photo-CVD method, and a plasma CVD method; preferably, a thermal CVD method is applied. More preferably, a low-pressure chemical vapor deposition (LPCVD) method, which is one of the thermal CVD methods, is applied. In a case where a thermal CVD method is applied, a source gas decomposed thermally tends to go around a side surface and a rear surface of a processed substrate, or around a side surface of the processed substrate because of a film formation principle and a structure of a film formation apparatus, so that an insulating layer tends to be formed also at the side surface and the rear surface of the processed substrate when the layer has been formed, or at the side surface of the processed substrate when the layer has been formed. FIGS. 2B, 2C, 2E and 2F show an example in which the first silicon oxide film 104 to the second silicon oxide film 108 are stacked in order on a surface, side surfaces, and a rear surface of the semiconductor substrate 102 by forming insulating layers by a thermal CVD method.

As the first silicon oxide film 104, a silicon oxide film or a silicon oxynitride film is formed. The film thickness may be determined as appropriate by a performer, and may be 10 to 500 nm inclusive, preferably 50 to 200 nm inclusive. In this mode, it is preferable to apply an LPCVD method and use a mixed gas of a silane gas and a nitrogen oxide gas as a source gas for the first silicon oxide film 104. As the silane gas, a compound containing silicon which is an inorganic compound, such as monosilane (SiH$_4$), disilane (Si$_2$H$_6$), or trisilane (Si$_3$H$_8$), is used. As the nitrogen oxide gas, nitrous oxide (N$_2$O), nitrogen dioxide (NO$_2$), or the like is used. Further, an inert gas such as argon, helium, or nitrogen, or a hydrogen gas may be mixed in a source gas. When the first silicon oxide film 104 is formed by an LPCVD method, it is preferable to apply a higher film formation temperature than a heating temperature for separating a semiconductor film from the semiconductor substrate in a later step. The film formation temperature depends on the decomposition temperature of the source gas; preferably, film formation temperatures of 600° C. or higher are applied. Further, it is preferable to perform the film formation under a reduced pressure of 10 to 10$^3$ Pa inclusive. If the first silicon oxide film 104 is formed by an LPCVD method using a mixed gas of monosilane and nitrous oxide as a source gas, for example, the film formation temperature can be as high as 600° C. or higher.

As the silicon nitride film 106, a silicon nitride film or a silicon nitride oxide film is formed. The film thickness may be determined as appropriate by a performer, and may be 10 to 200 nm inclusive, preferably 50 to 100 nm inclusive. In this mode, it is preferable to apply an LPCVD method and use a mixed gas of a silane gas containing chlorine and a gas containing nitrogen and hydrogen as constituent elements as a source gas for the silicon nitride film 106. As the silane gas containing chlorine, a compound containing silicon which is an inorganic compound, such as dichlorosilane (SiH$_2$Cl$_2$), trichlorosilane ($SiHCl_3$), or silicon tetrachloride ($SiCl_4$) is used. As the gas containing nitrogen and hydrogen as constituent elements, ammonia ($NH_3$), hydrazine ($N_2H_4$), or the like is used. Further, an inert gas such as argon, helium, or nitrogen, or a hydrogen gas may be mixed in the source gas. When the silicon nitride film 106 is formed by an LPCVD method, it is preferable to apply a higher film formation temperature than a heating temperature for separating the semiconductor film from the semiconductor substrate in a later step. The film formation temperature depends on the decomposition temperature of the source gas; preferably, film formation temperatures of 700° C. or higher are applied. Further, it is preferable to perform the film formation under a reduced pressure of 10 to $10^3$ Pa inclusive. If the silicon nitride film 106 is formed by an LPCVD method using a mixed gas of dichlorosilane and ammonia as a source gas, for example, the film formation temperature can be as high as 700° C. or higher.

In a case where a silane gas containing chlorine is used as the source gas, the silicon nitride film 106 obtained contains chlorine in the film. The silicon nitride film 106 can contain chlorine at a concentration of $1\times10^{17}$ to $1\times10^{21}$ atoms/cm³ inclusive, for example. The silicon nitride film 106 can function as a blocking film which prevents metal impurities such as an alkali metal or an alkaline earth metal from diffusing into the semiconductor film side; the blocking property against metal impurities can be improved by making the silicon nitride film 106 contain chlorine. Accordingly, also in a case where a glass substrate such as aluminosilicate glass is used as the supporting substrate in a later step, metal impurities such as sodium contained in the glass substrate can be effectively prevented from diffusing. In manufacturing a semiconductor device such as a field-effect transistor, diffusion of metal impurities such as an alkali metal or an alkaline earth metal has an adverse effect on operating characteristics of the semiconductor device to be completed, thereby lowering the reliability of the semiconductor device. The substrate for manufacturing a semiconductor device according to this embodiment mode is provided with the blocking film, which effectively prevents metal impurities from diffusing. Specifically, the silicon nitride film 106 whose blocking property is improved by containing chlorine is provided. Therefore, by manufacturing a semiconductor device with use of a substrate for manufacturing a semiconductor device according to this embodiment mode, reduction in reliability due to characteristic deterioration of the completed semiconductor device can be prevented.

With use of a mixed gas of a silane gas containing chlorine and a gas containing nitrogen and hydrogen as constituent elements as a source gas for forming the silicon nitride film 106, hydrogen chloride is generated by decomposition of the source gas in forming the film. It is preferable to apply film formation temperatures of 700° C. or higher to the silicon nitride film 106. With the high film formation temperature, a dangling bond at an interface between the semiconductor substrate 102 and the first silicon oxide film 104 can be terminated with chlorine by hydrogen chloride generated in forming the silicon nitride film 106. That is to say, a dangling bond at the interface between the semiconductor substrate 102 and the first silicon oxide film 104 can be terminated with chlorine by forming the silicon nitride film 106. As a result, the interface between the semiconductor substrate 102 and the first silicon oxide film 104 is inactivated, so that electric characteristics can be improved. Therefore, by manufacturing a semiconductor device with use of a substrate for manufacturing a semiconductor device according to this embodiment mode, the semiconductor device with high electric characteristics can be manufactured.

As the second silicon oxide film 108, a silicon oxide film or a silicon oxynitride film which has a planar surface and can form a hydrophilic surface is formed. The film thickness may be determined as appropriate by a performer, and may be 5 to 500 nm inclusive, preferably 10 to 50 nm inclusive. By forming the second silicon oxide film 108 with a thickness approximately within the above range, roughness of a film formation surface can be planarized and planarization of a growing surface of the film can be ensured. Further, mismatch between the second silicon oxide film 108 and the supporting substrate which is bonded later can be alleviated. It is preferable to form the second silicon oxide film 108 in a similar manner to the first silicon oxide film 104. Specifically, it is preferable to apply an LPCVD method and use a mixed gas of a silane gas and a nitrogen oxide gas as a source gas for the second silicon oxide film 108. As the silane gas, a compound containing silicon which is an inorganic compound, such as monosilane, disilane, or trisilane, is used. As the nitrogen oxide gas, nitrous oxide, nitrogen dioxide, or the like is used. Further, an inert gas such as argon, helium, or nitrogen, or a hydrogen gas may be mixed in a source gas. As the film formation temperature of the second silicon oxide film 108, a lower film formation temperature than a heating temperature for separating the semiconductor film from the semiconductor substrate, e.g., higher than or equal to 300° C. and lower than 600° C., may be applied; further, a higher temperature than the heating temperature, for example, 600° C. or higher, may be applied. The film formation temperature of the second silicon oxide film 108 depends on the decomposition temperature of the source gas. It is preferable to perform the film formation under a reduced pressure of 10 to $10^3$ Pa inclusive. Specifically, the second silicon oxide film 108 can be formed by an LPCVD method using a mixed gas of monosilane and nitrogen dioxide at a film formation temperature of 300 to 500° C. inclusive (e.g., 400° C.). Further, the second silicon oxide film 108 can also be formed by an LPCVD method using a mixed gas of monosilane and nitrous oxide as a source gas at a film formation temperature of 600° C. or higher.

In this mode, the silicon nitride film 106 has an effect of preventing metal impurities from diffusing into the semiconductor film side. If the silicon nitride film 106 is formed to be in direct contact with the semiconductor substrate 102, the silicon nitride film 106 can have a blocking effect; however, there occurs a problem in that the trap density is extremely high compared with a case of forming an oxide film. The first silicon oxide film 104 is formed between the semiconductor substrate 102 and the silicon nitride film 106 in order to prevent such a defect. The second silicon oxide film 108 has a function of alleviating internal stress of the silicon nitride film 106. Further, the second silicon oxide film 108 functions as a bonding layer which is bonded to the supporting substrate when the second silicon oxide film 108 has a planar surface and forms a hydrophilic surface. With formation of such a stacked-layer structure on the semiconductor substrate 102, contamination of the semiconductor film with metal impurities can be prevented, and electric characteristics of the interface can be improved, and stress distortion can be alleviated. Thus, a semiconductor device with high electric characteristics and high reliability can be manufactured.

A high film formation temperature can be applied to the first silicon oxide film 104 and the silicon nitride film 106, whereby dense films with excellent dielectric strength and high quality can be formed.

It is preferable to form the first silicon oxide film 104, the silicon nitride film 106, and the second silicon oxide film 108 successively because successive film formation can prevent contamination of an interface. The three-layer structure of the first silicon oxide film 104, the silicon nitride film 106, and the second silicon oxide film 108 functions as base insulating films between the supporting substrate and the semiconductor film. Therefore, successive film formation of the three-layer structure is effective for preventing contamination of an interface, because contamination of an interface has an adverse influence on electric characteristics.

Now an example is shown in which the first silicon oxide film 104, the silicon nitride film 106, and the second silicon oxide film 108 are formed. In this example, a silicon oxide film as the first silicon oxide film 104, a silicon nitride film as the silicon nitride film 106, and a silicon oxide film as the second silicon oxide film 108 are formed successively.

First, a silicon oxide film (the first silicon oxide film 104) is formed with a thickness of 100 nm on the semiconductor substrate 102 whose surface is cleaned. The silicon oxide film (the first silicon oxide film 104) is formed by an LPCVD method using a mixed gas of monosilane and nitrous oxide as a source gas, at film formation temperatures of 600 to 900° C. inclusive.

Subsequently, the source gas is changed to a mixed gas of dichlorosilane and ammonia in the same chamber of a CVD apparatus used for forming the silicon oxide film, and a silicon nitride film (the silicon nitride film 106) is formed with a thickness of 50 nm on the silicon oxide film. The film formation temperature is set to be 700 to 900° C. inclusive, which is almost the same as the film formation temperature of the silicon oxide film (the first silicon oxide film 104).

Next, the source gas is changed again to a mixed gas of monosilane and nitrous oxide in the same chamber of the CVD apparatus used for forming the silicon oxide film and the silicon nitride film, and a silicon oxide film (the second silicon oxide film 108) is formed with a thickness of 50 nm on the silicon nitride film (the silicon nitride film 106). The film formation temperature is set to be 600 to 900° C. inclusive, which is almost the same as the film formation temperature of the silicon oxide film (the first silicon oxide film 104).

For the silicon oxide film corresponding to the second silicon oxide film 108, a lower film formation temperature can be applied compared with the film formation temperatures of the silicon oxide film corresponding to the first silicon oxide film 104 and the silicon nitride film corresponding to the silicon nitride film 106. For example, after forming the first silicon oxide film 104 and the silicon nitride film 106 at film formation temperatures of 600° C. or higher, the second silicon oxide film 108 can be formed at film formation temperatures of lower than 600° C. As an example, the silicon oxide film (the first silicon oxide film 104) is formed on the semiconductor substrate 102 by an LPCVD method using a mixed gas of monosilane and nitrous oxide as a source gas, at film formation temperatures of 600 to 900° C. inclusive; subsequently, the source gas is changed to a mixed gas of dichlorosilane and ammonia in the same chamber of a CVD apparatus used for forming the silicon oxide film, and the silicon nitride film (the silicon nitride film 106) is formed on the silicon oxide film by an LPCVD method at film formation temperatures of 700 to 900° C. inclusive; subsequently, the source gas is changed to a mixed gas of monosilane and nitrogen dioxide in the same chamber of the CVD apparatus used for forming the silicon oxide film and the silicon nitride film, and the silicon oxide film (the second silicon oxide film 108) can be formed on the silicon nitride film by an LPCVD method also at film formation temperatures of 300 to 500° C. inclusive.

In the above manner, the first silicon oxide film 104, the silicon nitride film 106, and the second silicon oxide film 108 can be formed on the semiconductor substrate. The films are formed successively in the same chamber by an LPCVD method, whereby a stacked-layer structure can be formed efficiently only by changing the source gases. If different film formation temperatures are applied to each film, the source gases may be changed and the temperature in the chamber may be controlled.

It is also possible to form the first silicon oxide film 104 and the second silicon oxide film 108 by a plasma CVD method; however, throughput can be reduced because process apparatuses are different.

In the case where the silicon oxide film is formed by an LPCVD method using a mixed gas of monosilane and nitrous oxide as a source gas, a film containing an excessive amount of silicon can be formed in an early stage of the film formation, or a film having a defect can be formed by an oxidation reaction due to the nitrous oxide. If a silicon oxide film having a defect or the like is formed at an interface with the semiconductor substrate, interface characteristics can be influenced and electric characteristics can be degraded. Therefore, it is also possible that the semiconductor substrate 102 undergoes oxidation treatment in advance to form an oxide film on the surface, and then the first silicon oxide film 104, the silicon nitride film 106, and the second silicon oxide film 108 are stacked on the oxide film. As the oxidation treatment of the semiconductor substrate 102, heat treatment or plasma treatment in an atmosphere containing oxygen, UV ozone treatment, or the like is applied. The oxide film with high quality is formed at an interface between the semiconductor substrate and a film thereon, whereby electric characteristics of the interface can be improved.

Next, the semiconductor substrate 102 is irradiated with ions 110 accelerated by an electric field, so that a weakened layer 112 is formed at a given depth in the semiconductor substrate 102 (see FIG. 2C). In this mode, irradiation with ions 110 is performed from a top surface (a surface which is not a side surface) side of the semiconductor substrate 102 on which the stacked layers of the first silicon oxide film 104, the silicon nitride film 106, and the second silicon oxide film 108 are formed.

The depth of the weakened layer 112 formed in the semiconductor substrate 102 can be controlled by the kind of ions 110 for irradiation, the acceleration voltage of the ions 110, and the irradiation angle of the ions 110. The weakened layer 112 is formed in a region at a depth which is close to an average penetration depth of the ions from the surface of the semiconductor substrate 102. Further, the depth of the weakened layer 112 determines the thickness of the semiconductor film which is later transferred to the supporting substrate. Therefore, the acceleration voltage and dose of the ions 110 in the ion irradiation is adjusted in consideration of the thickness of the semiconductor film which is later transferred. Preferably, the thickness of the semiconductor film is 5 to 500 nm inclusive, more preferably 10 to 200 nm inclusive.

It is preferable to use an ion doping apparatus for the irradiation with the ions 110. That is to say, it is preferable to employ a doping method in which the ion irradiation is performed without mass separation of a plurality of ion species generated by exciting the source gas into a plasma state. In this mode, it is preferable to perform the irradiation with ions which each include one atom or a plurality of the same atoms and have different mass. Such ion doping may be performed with an accelerating voltage of 10 to 100 kV inclusive, preferably 30 to 80 kV inclusive, at a dose of $1\times10^{16}$ to $4\times10^{16}$ ions/cm$^2$ inclusive, and with a beam current density of 2 µA/cm$^2$ or more, preferably 5 µA/cm$^2$ or more, more preferably 10 µA/cm$^2$ or more.

As the ions 110, it is preferable to use ions which each include one atom or a plurality of the same atoms, have different mass, and are generated by exciting a source gas selected from hydrogen, heavy deuterium, helium, or a halogen element such as fluorine into a plasma state. In a case of using hydrogen ions, it is preferable that H$^+$ ions, H$_2^+$ ions, and H$_3^+$ ions be contained in the hydrogen ions with a high percentage of H$_3^+$ ions. Thus, efficiency of the ion irradiation can be increased and time of the ion irradiation can be shortened. As a result, hydrogen can be contained in the region of the weakened layer 112 formed in the semiconductor substrate 102 at $1\times10^{20}$ atoms/cm$^3$ (preferably $1\times10^{21}$ atoms/cm$^3$) or more. The irradiation may be performed with only one kind of H$^+$ ions, H$_2^+$ ions, or H$_3^+$ ions. When a high-concentration hydrogen-irradiated region is locally formed in the semiconductor substrate 102, a crystal structure is disturbed and minute cavities are formed, whereby the weakened layer 112 can have a porous structure. In this case, there occurs a change in volume of the minute cavities formed in the weakened layer 112 by heat treatment at a relatively low temperature. And then, cleavage is made along the weakened layer 112, whereby a thin semiconductor film can be formed.

The weakened layer 112 can also be formed by irradiating the semiconductor substrate 102 with ions which have undergone mass separation. Also in this case, it is preferable to use ions with large mass (e.g., H$_3^+$ ions) for selective irradiation, which has a similar effect to the above.

In some cases, the semiconductor substrate 102 is irradiated with the ions 110 at a high dose rate in order to form the weakened layer 112 at a given depth. In this mode, the semiconductor substrate 102 is irradiated with the ions 110 through the stacked layers of the first silicon oxide film 104, the silicon nitride film 106, and the second silicon oxide film 108 formed on the semiconductor substrate 102; thus, roughness at the surface of the semiconductor substrate 102 due to ion irradiation can be prevented.

The supporting substrate 120 is prepared (see FIG. 2D). A substrate having an insulating surface or an insulating substrate is used as the supporting substrate 120, as described above. Specifically, a variety of glass substrates for electronic industry, such as an aluminosilicate glass substrate, an aluminoborosilicate glass substrate, or a barium borosilicate glass substrate, a quartz substrate, a ceramic substrate, a sapphire substrate, a metal substrate whose surface is covered with an insulating film, or the like can be used. In this mode, a glass substrate is used as the supporting substrate 120.

The semiconductor substrate 102 and the supporting substrate 120 are superposed to be bonded to each other with the first silicon oxide film 104, the silicon nitride film 106, and the second silicon oxide film 108, which are stacked on the semiconductor substrate 102 in this order, interposed therebetween (see FIG. 2E). In this mode, the supporting substrate 120 and the second silicon oxide film 108, which is the top layer of the stacked layers formed on the semiconductor substrate 102, are arranged to face each other and closely bonded to each other, thereby forming a bond.

Surfaces which are to form a bond is sufficiently cleaned. Then, the supporting substrate 120 and the second silicon oxide film 108 are brought into close contact with each other, whereby a bond is formed. It is probable that Van der Waals forces act at the initial stage of bonding and that a strong bond due to hydrogen bonds can be formed by pressing the supporting substrate 120 and the semiconductor substrate 102.

Before the supporting substrate 120 and the semiconductor substrate 102 are brought into close contact with each other, one or both of the bonding surfaces may be cleaned with ozone-containing water, oxygen-containing water, hydrogen-containing water, pure water, or the like. If the bonding surface is cleaned, bonding is performed after drying.

In order to form an excellent bond between the semiconductor substrate 120 and the supporting substrate 120, one or both of the bonding surfaces may be activated. For example, the surface which is to form a bond is irradiated with an atomic beam or an ion beam. If an atomic beam or an ion beam is used, an inert gas (e.g., argon) neutral atom beam or an inert gas ion beam can be used. Alternatively, the bonding surface can also be activated by plasma irradiation or radical treatment. Such surface treatment makes it possible to increase bonding strength between different kinds of materials even at temperatures of 200 to 400° C. inclusive.

After bonding the supporting substrate 120 and the semiconductor substrate 102 to each other, it is preferable to perform heat treatment or pressure treatment. Heat treatment or pressure treatment can improve bonding strength. It is preferable that the heat treatment be performed at temperatures lower than or equal to the heat-resistant temperature of the supporting substrate 120. In this mode, preferably, the heat treatment temperature is 600° C. or lower because a glass substrate is used as the supporting substrate 120. In a case of pressure treatment, it is performed so that pressure is applied in a perpendicular direction to the bonding surface, and in consideration of the resistance to pressure of the supporting substrate 120 and the semiconductor substrate 102.

Heat treatment is performed, whereby the semiconductor substrate 102 is separated with a semiconductor film 140 left over the supporting substrate 120 (see FIG. 2F). It is preferable that the heat treatment be performed at temperatures that are lower than or equal to the film formation temperatures of the stacked layers formed on the semiconductor substrate 102 and also are lower than or equal to the heat resistance temperature of the supporting substrate 120, preferably at temperatures higher than or equal to 400° C. and lower than 600° C. The heat treatment at temperatures in this range causes change in volume of the minute cavities formed in the weakened layer 112, whereby the semiconductor substrate 102 can be cleaved along the weakened layer 112. The second silicon oxide film 108 is bonded to the supporting substrate 120, functioning as a bonding layer; thus, the semiconductor film 140 with the same crystallinity as that of the semiconductor substrate 102 is left over the supporting substrate 120. In this mode, a single-crystalline silicon film can be formed as the semiconductor film 140 because a single-crystalline silicon substrate is used as the semiconductor substrate 102. In this manner, the single-crystalline semiconductor film can be formed over the supporting substrate 120 by using a single-crystalline semiconductor substrate as the semiconductor substrate 102.

By separation of the semiconductor substrate 102, a substrate for manufacturing a semiconductor device having an SOI structure is manufactured in which the semiconductor film 140 is fixed over the supporting substrate 120 with the second silicon oxide film 108, the silicon nitride film 106, and the first silicon oxide film 104 interposed therebetween. The silicon nitride film, which has a high blocking property, is formed between the semiconductor film 140, which is separated from the semiconductor substrate 102, and the supporting substrate 120. Therefore, a semiconductor device with high reliability can be manufactured using the substrate for manufacturing a semiconductor device that can be obtained according to this embodiment mode.

As shown in FIG. 2F, the insulating layers (the first silicon oxide film 104, the silicon nitride film 106, and the second silicon oxide film 108) formed on side surfaces of the semiconductor substrate 102 are not bonded to the supporting substrate 120 in many cases. A probable reason is that the weakened layer 112 is not formed in the insulating layers (the first silicon oxide film 104, the silicon nitride film 106, and the second silicon oxide film 108) by irradiation with the ions 110. Further, a peripheral portion of the semiconductor substrate 102 also is not bonded to the supporting substrate 120 in some cases. A probable reason is that the semiconductor substrate 102 is not easily separated at the peripheral portion because the semiconductor substrate 102 is chamfered at the peripheral portion or the semiconductor substrate 102 has an edge roll-off, and thus the supporting substrate 120 and the second silicon oxide film 108 are not easily brought into close contact with each other. Thus, the semiconductor film 140 that is smaller than the semiconductor substrate 102 is left over the supporting substrate 120. A projecting portion is formed around the semiconductor substrate 102 which is separated off, and the first silicon oxide film 104, the silicon nitride film 106, and the second silicon oxide film 108 which have not been bonded to the supporting substrate 120 are left as the projecting portion.

The semiconductor film 140 transferred to the supporting substrate 120 has a crystal defect, and a surface is not planar and is rough because of the ion irradiation step and the separation step. Further, the weakened layer 112 is left on the surface of the semiconductor film 140 in some cases. A crystal defect or roughness of the semiconductor film 140 leads to difficulty in forming a thin gate insulating film with excellent dielectric strength in manufacturing a semiconductor device, deterioration in characteristics of a semiconductor device, or the like. Therefore, it is preferable to perform planarization treatment to the semiconductor film 140 (see FIG. 2G).

For example, it is preferable to perform chemical mechanical polishing (CMP) to the semiconductor film 140. The planarization may also be performed by irradiation of the semiconductor film 140 with a laser beam, or by heat treatment with an electric furnace, a lamp annealing furnace, a rapid thermal annealing (RTA) apparatus, or the like. The laser beam irradiation is preferably performed in a nitrogen atmosphere at an oxygen concentration of 10 ppm or less because the surface of the semiconductor film can be roughened when the laser beam irradiation is performed in an oxygen atmosphere. By laser beam irradiation or heat treatment to the semiconductor film, it is also possible to repair a crystal defect, damage, or the like of the semiconductor film as well as to planarize the semiconductor film. Further, it is also possible to repair a layer at the surface which is damaged by the CMP treatment, by laser beam irradiation or heat treatment after the CMP treatment. Furthermore, CMP or the like may be performed for the purpose of thinning the semiconductor film obtained. A variety of semiconductor devices can be manufactured using the substrate 100 for manufacturing a semiconductor device formed by the method described above.

Although this embodiment mode shows an example in which the supporting substrate 120 has a larger area than the semiconductor substrate 102, the present invention is not particularly limited. The supporting substrate 120 may have an area almost equal to that of the semiconductor substrate 102. Further, the supporting substrate 102 may have a different shape from the semiconductor substrate 102.

The semiconductor substrate 102 from which the semiconductor film 140 is separated can be reused. That is, the semiconductor substrate 102 which is separated as shown in FIG. 2F can be reused as a semiconductor substrate in FIG. 2A. If the semiconductor substrate 102 is reused, it is preferable to planarize a separation plane (the weakened layer 112, which is a cleavage plane) of the semiconductor substrate 102. Planarization treatment here may be performed in a similar manner to the above planarization of the semiconductor film 140; CMP treatment, laser beam irradiation, heat treatment, or the like may be performed as appropriate. Further, plural kinds of treatment may be combined to achieve planarization or to repair a crystal defect. The projecting portion formed around the semiconductor substrate 102 which has been separated off may be removed by etching or the like as appropriate. Significant reduction in cost can be achieved by reusing a base semiconductor substrate in manufacturing a substrate for manufacturing a semiconductor device. It is needless to mention that the semiconductor substrate 102 from which the semiconductor film 140 has been separated can be used for a purpose other than that of manufacturing a substrate for manufacturing a semiconductor device.

A bonding layer may be provided for the supporting substrate 120. FIGS. 3A to 3G show an example of a method for manufacturing a substrate for manufacturing a semiconductor device, in which a bonding layer is provided for the supporting substrate 120.

A semiconductor substrate 102 is prepared (see FIG. 3A). A first silicon oxide film 104, a silicon nitride film 106, and a second silicon oxide film 108 are formed in this order on a surface of the cleaned semiconductor substrate 102 (see FIG. 3B). Irradiation with ions 110 is performed from the top surface side of the semiconductor substrate 102 where the first silicon oxide film 104, the silicon nitride film 106, and the second silicon oxide film 108 are formed, whereby a weakened layer 112 is formed at a given depth of the semiconductor substrate 102 (see FIG. 3C). FIGS. 3A to 3C conform with description of FIGS. 2A to 2C.

A supporting substrate 120 is prepared. A bonding layer 124 is formed over the supporting substrate 120 (see FIG. 3D). In this example, the bonding layer 124 is formed over the supporting substrate 120 with a barrier film 122 interposed therebetween.

As the supporting substrate 120, a substrate having an insulating surface or an insulating substrate is used, as described above. Concretely, a variety of glass substrates for electronic industry, such as an aluminosilicate glass substrate, an aluminoborosilicate glass substrate, or a barium borosilicate glass substrate, a quartz substrate, a ceramic substrate, a sapphire substrate, a metal substrate whose surface is covered with an insulating film, or the like can be given.

As the bonding layer 124, it is preferable to form a film which has a planar surface and can form a hydrophilic surface. As such a bonding layer 124, an insulating film formed by a chemical reaction is preferable. For example, a film formed by a thermal or chemical reaction is suitable. The reason is that a film formed by a chemical reaction can easily ensure planarity of a surface. It is preferable to form the bonding layer 124 that has a planar surface and forms a hydrophilic surface with a thickness of 0.2 to 500 nm inclusive. The thickness of the bonding layer 124 in the above range can planarize a rough film formation surface and ensure planarity of a developing surface of the bonding layer 124.

If a glass substrate is used as the supporting substrate 120, it is preferable that the bonding layer 124 be formed at temperatures lower than or equal to a strain point of the glass substrate, preferably at 600° C. or lower. As the bonding layer 124 that satisfies such conditions, it is preferable to use a silicon oxide film which is formed by a plasma CVD method using organic silane as a source gas. As organic silane, a compound containing silicon, such as tetraethoxysilane (abbr.: TEOS; chemical formula: $Si(OC_2H_5)_4$), tetramethylsilane (abbr.: TMS; chemical formula: $Si(CH_3)_4$), trimethylsilane (chemical formula: $(CH_3)_3SiH$), tetramethylcyclotetrasiloxane (abbr.: TMCTS), octamethylcyclotetrasiloxane (abbr.: OMCTS), hexamethyldisilazane (abbr.: HMDS), triethoxysilane (chemical formula: $SiH(OC_2H_5)_3$), or trisdimethylaminosilane (chemical formula: $SiH(N(CH_3)_2)_3$), can be used. If the silicon oxide film is formed by a plasma CVD method using organic silane as a source gas, it is preferable to mix a gas which provides oxygen. As a gas which provides oxygen, oxygen, nitrous oxide, nitrogen dioxide, or the like can be used. Further, an inert gas such as argon, helium, or nitrogen, or a hydrogen gas can be mixed. As the bonding layer 124, it is also possible to employ a silicon oxide film formed by a plasma CVD method using silane such as monosilane, disilane, or trisilane as a source gas. Also in this case, it is preferable to mix an inert gas, a gas which provides oxygen, or the like. In forming the bonding layer 124 by a plasma CVD method, a temperature determined based on the heat resistance of the supporting substrate 120, specifically, a temperature lower than or equal to the strain point is applied. For example, a film formation temperature of 350° C. or lower can be applied. For later heat treatment for separating a semiconductor film from the semiconductor substrate such as a single-crystalline semiconductor substrate or a polycrystalline semiconductor substrate, a higher heating temperature than the film formation temperature for forming the bonding layer 124 by a CVD method is applied. As the bonding layer 124, an insulating film including a siloxane (Si—O—Si) bond can also be used. The insulating film including a siloxane bond may be formed by an application method such as spin coating.

In a case where a glass substrate for electronic industry, such as an aluminosilicate glass substrate, an aluminoborosilicate glass substrate, or a barium borosilicate glass substrate, is used as the supporting substrate 120, the substrate contains a trace amount of metal impurities, e.g., alkali metal such as sodium, or alkaline earth metal. Such metal impurities can be diffused into a semiconductor film from the supporting substrate to have an adverse effect on characteristics of a semiconductor device to be manufactured. As described above, a blocking property against metal impurities is obtained owing to the silicon nitride film 106 provided for the semiconductor substrate 102; the blocking property can be improved by further providing the barrier film 122, which can block entrance of metal impurities, also for the supporting substrate 120. The barrier film 122 can have a single-layer structure or a stacked-layer structure, and a thickness of 10 to 400 nm inclusive. The barrier film 122 includes one layer which has an excellent effect of blocking entrance of metal impurities such as an alkali metal or an alkaline earth metal. Examples of such a film include a silicon nitride film, a silicon nitride oxide film, an aluminum nitride film, and the like.

For example, when the barrier film 122 has a single-layer structure, a silicon nitride film, a silicon nitride oxide film, or an aluminum nitride film can be formed with a thickness of 10 to 200 nm inclusive. When the barrier film 122 has a stacked-layer structure of two layers, stacked layers of a silicon nitride film and a silicon oxide film, stacked layers of a silicon nitride film and a silicon oxynitride film, stacked layers of a silicon nitride oxide film and a silicon oxide film, or stacked layers of a silicon nitride oxide film and a silicon oxynitride film can be formed, for example. In the stacked two layers shown above as examples, it is preferable to form the former film on the supporting substrate 120 in order that internal stress of the barrier film 122 does not act on the semiconductor film by forming a film with a high blocking property for a lower layer (the supporting substrate 120 side) and a film which buffers the internal stress of the lower layer for an upper layer (the bonding layer 124 side) in the barrier film 122 of a two-layer structure.

The semiconductor substrate 102 and the supporting substrate 120 are superposed to be bonded to each other, with the first silicon oxide film 104, the silicon nitride film 106, and the second silicon oxide film 108, which are stacked in this order on the semiconductor substrate 102, and the barrier film 122 and the bonding layer 124, which are formed on the supporting substrate 120, interposed therebetween (see FIG. 3E).

In this mode, the bonding layer 124 provided for the supporting substrate 120 and the second silicon oxide film 108, which is a top layer of the stacked layers provided for the semiconductor substrate 102, are arranged to face each other and brought into close contact with each other, thereby forming a bond. Surfaces which are to form a bond is sufficiently cleaned. A strong bond can be formed with hydrogen bonds by pressing the supporting substrate 120 and the semiconductor substrate 102. Further, the bonding strength can be increased by providing the bonding layer 124 for a surface which forms the bond of the supporting substrate 120. Furthermore, one or both of the bonding surfaces of the second silicon oxide film 108 and the bonding layer 124 may be activated in order to form an excellent bond between the supporting substrate 120 and the semiconductor substrate 102. In addition, the bonding strength can be further increased by performing heat treatment or pressure treatment after bonding the supporting substrate 120 and the semiconductor substrate 102 to each other.

Heat treatment is performed, whereby the semiconductor substrate 102 is separated off with a semiconductor film 140 left over the supporting substrate 120; thus, a substrate for manufacturing a semiconductor device and with an SOI structure is manufactured (see FIG. 3F). Preferably, planarization treatment is performed on the semiconductor film 140 (see FIG. 3G). FIGS. 3F and 3G conform with description of FIGS. 2F and 2G.

In the above manner, a substrate for manufacturing a semiconductor device in which the semiconductor film 140 is fixed over the supporting substrate 120 with the stacked layers including the barrier film 122, the bonding layer 124, the second silicon oxide film 108, the silicon nitride film 106, and the first silicon oxide film 104 in this order interposed therebetween, can be manufactured.

In a case where a silicon oxide film is formed on a semiconductor substrate by an LPCVD method, an interface property can have a problem, as described above. In view of the problem, an oxide film may be formed on a surface of the semiconductor substrate. Description is made below with reference to FIGS. 4A to 4G.

A semiconductor substrate 102 is prepared. An oxide film 101 is formed on one surface of the cleaned semiconductor substrate 102 (see FIG. 4A).

As the oxide film 101, it is preferable to form a thin film with a thickness of about 1 to 10 nm inclusive by performing oxidation treatment to the surface of the semiconductor substrate 102. As the oxidation treatment, preferably, UV ozone treatment or plasma treatment in an oxygen atmosphere is performed. The UV ozone treatment means ultraviolet irradiation treatment in an ozone atmosphere. Examples of plasma treatment include plasma treatment using microwaves (a typical frequency is 2.45 GHz); for example, treatment using plasma which is excited by microwaves and has an electron density of $1\times10^{11}$ to $1\times10^{13}/cm^3$ inclusive and an electron temperature of 0.5 to 1.5 eV inclusive is also included. In the above manner, a thin and dense oxide film can be formed by performing oxidation treatment to a surface of a substrate. Further, the film can have an excellent interface property because the semiconductor substrate is directly oxidized. For example, if a single-crystalline silicon substrate is used as the semiconductor substrate 102, a silicon oxide film is formed as the oxide film 101.

A first silicon oxide film 104, a silicon nitride film 106, and a second silicon oxide film 108 are formed in this order on the oxide film 101, which is formed on the one surface of the semiconductor substrate 102 (see FIG. 4B). Irradiation with ions 110 is performed from the top surface side of the semiconductor substrate 102 where the oxide film 101, the first silicon oxide film 104, the silicon nitride film 106, and the second silicon oxide film 108 are formed, whereby a weakened layer 112 is formed at a given depth of the semiconductor substrate 102 (see FIG. 4C).

A supporting substrate 120 is prepared (see FIG. 4D). And then, the semiconductor substrate 102 and the supporting substrate 120 are superposed to be bonded to each other with the oxide film 101, the first silicon oxide film 104, the silicon nitride film 106, and the second silicon oxide film 108, which are stacked in this order on the semiconductor substrate 102, interposed therebetween (see FIG. 4E).

In FIG. 4E, the supporting substrate 120 and the second silicon oxide film 108, which is a top layer of the stacked layers formed on the semiconductor substrate 102, are arranged to face each other and brought into close contact with each other, thereby forming a bond. Note that this embodiment mode does not have any particular limitation, and a bonding layer or a barrier film may be formed over the supporting substrate 120 as shown in FIG. 3D. If a bonding layer is formed over the supporting substrate 120, the bonding layer formed over the supporting substrate 120 and the second silicon oxide film 108 formed over the semiconductor substrate 102 are brought into close contact with each other, thereby forming a bond.

Heat treatment is performed, whereby the semiconductor substrate 102 is separated off with a semiconductor film 140 left over the supporting substrate 120; thus, a substrate for manufacturing a semiconductor device and with an SOI structure is manufactured (see FIG. 4F). Preferably, planarization treatment is performed on the semiconductor film 140 (see FIG. 4G). Detailed description of FIGS. 4B to 4G conforms with description of FIGS. 2B to 2G.

In the above manner, a substrate for manufacturing a semiconductor device can be manufactured in which the semiconductor film 140 is fixed over the supporting substrate 120, with the stacked layers including the second silicon oxide film 108, the silicon nitride film 106, the first silicon oxide film 104, and the oxide film 101 in this order interposed therebetween. In this mode, the oxide film 101 obtained by performing oxidation treatment to the semiconductor substrate 102 is formed between the semiconductor film 140 and the first silicon oxide film 104. Therefore, the interface property is excellent, and electric characteristics can be improved in a semiconductor device manufactured using a substrate for manufacturing a semiconductor device to which the present invention is applied. Further, the semiconductor device can have high reliability because a film with a blocking property against metal impurities is formed between a semiconductor film and a supporting substrate.

With thermal oxidation to a semiconductor substrate, an oxide film can also be formed. Description is made below with reference to FIGS. 5A to 5G.

A semiconductor substrate 102 is prepared. The cleaned semiconductor substrate 102 is oxidized thermally, whereby a thermal oxide film 103 is formed (see FIG. 5A). As the thermal oxidation, it is preferable to perform oxidation in an oxygen atmosphere in which halogen is added although dry oxidation may be performed. A typical substance including halogen is HCl; further, one kind or plural kinds of substances selected from HF, $NF_3$, HBr, $Cl_2$, $ClF_3$, $BCl_3$, $F_2$, $Br_2$, or the like can be used. As an example of such thermal oxidation, it is preferable to perform thermal oxidation in an atmosphere containing HCl in 0:5 to 10 vol % inclusive (preferably 3 vol %) with respect to oxygen, at temperatures of 900 to 1150° C. inclusive (typically, 1000° C.). The treatment time may be 0.1 to 6 hours inclusive, preferably 0.5 to 1 hour inclusive.

Heat treatment at temperatures in such a range can also provide a gettering effect due to the halogen element for the semiconductor substrate 102. As the gettering effect, in particular, an effect of removing a metal impurity can be provided. That is, with action of chlorine, an impurity such as a metal turns into a volatile chloride and is released into air, thereby being removed from the semiconductor substrate 102. In particular, gettering using halogen is effective when a surface of the semiconductor substrate 102 has undergone CMP treatment. Further, hydrogen has an effect of compensating defects in an interface between the semiconductor substrate 102 and the thermal oxide film 103 to lower a local level density of the interface.

Halogen in the thermal oxide film 103 has an effect of trapping a heavy metal, which is an extrinsic impurity, to prevent the semiconductor substrate 102 from being contaminated. Preferably, the thermal oxide film 103 contains halogen at a concentration of $1\times10^{17}$ to $1\times10^{21}$ atoms/cm$^3$ inclusive, thereby trapping impurities such as a metal to function as a protective film, which prevents the semiconductor substrate 102 from being contaminated. Typical heavy metals are Fe, Cr, and Ni, and can further include Mo. Such a heavy metal may be introduced into the semiconductor substrate 102 in a step of forming a weakened layer by irradiating the semiconductor substrate 102 with ions which are not subjected to mass separation. The thermal oxide film 103 can getter impurities such as a heavy metal, which has an adverse effect on the semiconductor film, by containing halogen by HCl oxidation or the like. Heat treatment which is performed after forming the thermal oxide film 103 precipitates a metal which is an impurity contained in the semiconductor substrate 102 into the thermal oxide film 103, and the metal is trapped by reacting with halogen (e.g., chlorine); thus, the impurity trapped in the thermal oxide film 103 can be fixed, thereby preventing the semiconductor substrate 102 from being contaminated. Further, the thermal oxide film 103 containing halogen has an effect of blocking a metal impurity such as an alkali metal or an alkaline earth metal. Thus, the thermal oxide film 103 traps and does not allow rediffusion of a metal element, which is a lifetime killer of a semiconductor, to prevent a metal impurity in a glass substrate or the like, such as an alkali metal or an alkaline earth metal, from diffusing into the semiconductor film side, whereby a semiconductor device such as a field-effect transistor can have high performance.

A first silicon oxide film 104, a silicon nitride film 106, and a second silicon oxide film 108 are formed in this order over the surface of the semiconductor substrate 102, on which the thermal oxide film 103 is formed (see FIG. 5B). Irradiation with ions 110 is performed from the top surface side of the semiconductor substrate 102 where the thermal oxide film 103, the first silicon oxide film 104, the silicon nitride film 106, and the second silicon oxide film 108 are formed, whereby a weakened layer 112 is formed at a given depth of the semiconductor substrate 102 (see FIG. 5C).

A supporting substrate 120 is prepared (see FIG. 5D). Then, the semiconductor substrate 102 and the supporting substrate 120 are superposed to be bonded to each other with the thermal oxide film 103, the first silicon oxide film 104, the silicon nitride film 106, and the second silicon oxide film 108, which are stacked in this order on the semiconductor substrate 102, interposed therebetween (see FIG. 5E).

In FIG. 5E, the supporting substrate 120 and the second silicon oxide film 108, which is a top layer of the stacked layers formed on the semiconductor substrate 102, are arranged to face each other and brought into close contact with each other, thereby forming a bond. Note that this embodiment mode does not have any particular limitation, and a bonding layer or a barrier film may be formed over the supporting substrate 120 as shown in FIG. 3D. If a bonding layer is formed over the supporting substrate 120, the bonding layer formed over the supporting substrate 120 and the second silicon oxide film 108 formed over the semiconductor substrate 102 are brought into close contact with each other, thereby forming a bond.

Heat treatment is performed, whereby the semiconductor substrate 102 is separated off with a semiconductor film 140 left over the supporting substrate 120; thus, a substrate for manufacturing a semiconductor device and with an SOI structure is manufactured (see FIG. 5F). Preferably, planarization treatment is performed on the semiconductor film 140 (see FIG. 5G). Detailed description of FIGS. 5B to 5G conforms with description of FIGS. 2B to 2G.

As shown in FIG. 5F, the thermal oxide film 103 formed on side surfaces of the semiconductor substrate 102 is also not bonded to the supporting substrate 120 in many cases. A probable reason is that the weakened layer 112 is not formed in the thermal oxide film 103 by irradiation with the ions 110. Thus, a projecting portion is formed around the semiconductor substrate 102 which is separated off, and the thermal oxide film 103, the first silicon oxide film 104, the silicon nitride film 106, and the second silicon oxide film 108 which have not been bonded to the supporting substrate 120 are left as the projecting portion.

In the above manner, a substrate for manufacturing a semiconductor device can be manufactured in which the semiconductor film 140 is fixed over the supporting substrate 120, with the stacked layers including the second silicon oxide film 108, the silicon nitride film 106, the first silicon oxide film 104, and the thermal oxide film 103 in this order interposed therebetween. In this mode, the thermal oxide film 103 obtained by thermally oxidizing the semiconductor substrate 102 is formed between the semiconductor film 140 and the first silicon oxide film 104, thereby having an excellent interface property. Further, a gettering effect against metal impurities can be provided by making the thermal oxide film 103 contain halogen. Thus, electric characteristics can be improved and high performance can be achieved in a semiconductor device manufactured using a substrate for manufacturing a semiconductor device to which the present invention is applied. Even if a glass substrate containing a metal impurity such as an alkali metal or an alkaline earth metal is used as the supporting substrate, a semiconductor device with high reliability can be manufactured because the film with a blocking property against metal impurities is formed between the semiconductor film and the supporting substrate.

This embodiment mode can be combined as appropriate with another embodiment mode shown in this specification.

Embodiment Mode 2

This embodiment mode illustrates an example in which a semiconductor device is manufactured using a substrate for manufacturing a semiconductor device according to the present invention, with reference to FIGS. 6A to 7B.

Figure 6A:
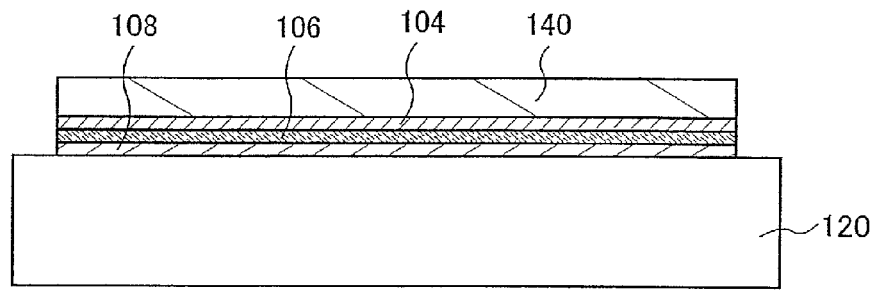
FIGS. 6A to 6D are diagrams showing an example of a method for manufacturing a semiconductor device using a substrate for manufacturing a semiconductor device.

A substrate for manufacturing a semiconductor device is prepared (see FIG. 6A). This mode shows an example in which a substrate for manufacturing a semiconductor device with an SOI structure in which the semiconductor film 140 is fixed over the supporting substrate 120 with the stacked second silicon oxide film 108, the silicon nitride film 106, and the first silicon oxide film 104 interposed therebetween as shown in FIG. 1 is used. The present invention does not have any particular limitation, and a substrate for manufacturing a semiconductor device with another structure shown in this specification can be employed.

The semiconductor film 140 has a thickness of 5 to 500 nm inclusive, preferably 10 to 200 nm inclusive, more preferably 10 to 60 nm inclusive. The thickness of the semiconductor film 140 can be set as appropriate by controlling the depth at which the weakened layer 112, which is described in the above embodiment mode, is formed. Further, the semiconductor film 140 of the substrate for manufacturing a semiconductor device may be thinned by etching or the like to a desired thickness. The semiconductor film 140 can be thinned by dry etching using a chlorine-based gas such as $Cl_2$, $BCl_3$, or $SiCl_4$, a fluorine-based gas such as $CF_4$, $NF_3$, or $SF_6$, a HBr gas, or the like. It is also possible to partly change the semiconductor film 140 in quality by oxidation treatment, nitridation treatment, or the like and etch the quality-changed portion selectively.

In the semiconductor film 140, it is preferable to add a p-type impurity element such as boron, aluminum, or gallium, or an n-type impurity element such as phosphorus or arsenic into a formation region of an n-channel field-effect transistor or a p-channel field-effect transistor. That is, a p-type impurity element is added into a formation region of an n-channel field-effect transistor, or an n-type impurity element is added into a formation region of a p-channel field-effect transistor, thereby forming a "well region." The dose of impurity ions may range from about $1 \times 10^{12}$ to $1 \times 10^{14}$ ions/$cm^2$ inclusive. Furthermore, in a case of controlling the threshold voltage of the field-effect transistor, a p-type or n-type impurity element may be added into the well region.

Figure 6B:
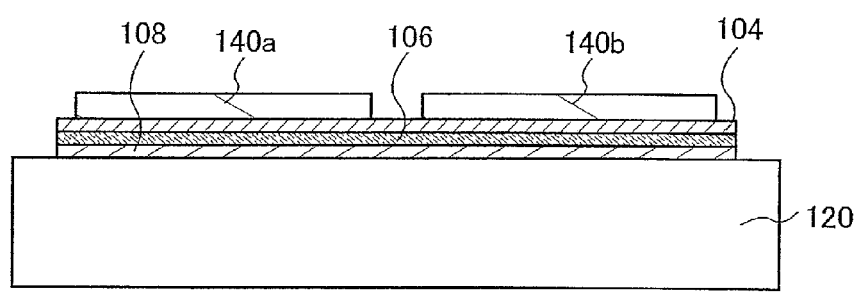
Figure 6C:
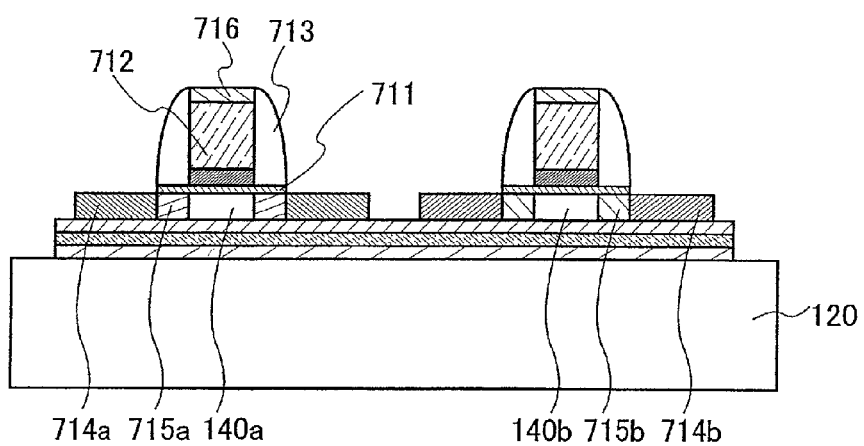

Next, the semiconductor film 140 is etched selectively to form semiconductor films 140a and 140b, which are separated in island shapes in accordance with a placement of semiconductor elements (see FIG. 6B).

Although this mode shows an example in which elements are separated from each other by etching the semiconductor film 140 into island shapes, the present invention is not particularly limited to this example. For example, elements may be separated by embedding an insulating film in the semiconductor film in accordance with a placement of the semiconductor elements.

Next, a gate insulating film 711, a gate electrode 712, and sidewall insulating films 713 are formed over each of the semiconductor films 140a and 140b. The sidewall insulating films 713 are formed on side surfaces of the gate electrode 712. Then, first impurity regions 714a and second impurity regions 715a are formed in the semiconductor film 140a, and first impurity regions 714b and second impurity regions 715b are formed in the semiconductor film 140b. An insulating film 716 is formed over the gate electrode 712. The insulating film 716 is formed using a silicon nitride film, and is used as a hard mask for etching in forming the gate electrode 712 (see FIG. 6C).

Figure 6D:
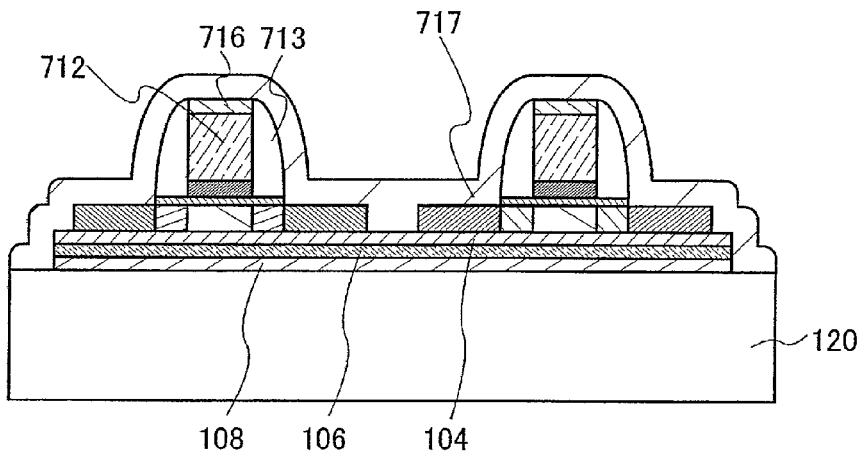
Figure 7A:
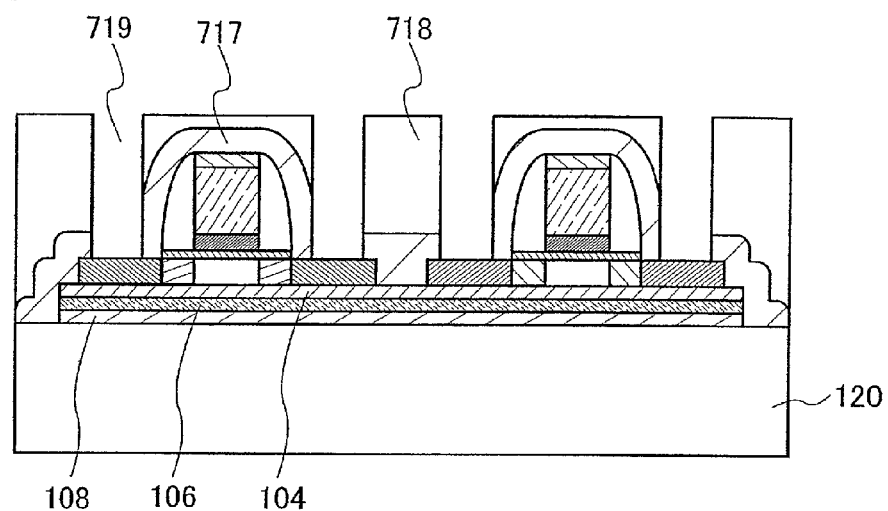
FIGS. 7A and 7B are diagrams showing an example of a method for manufacturing a semiconductor device using a substrate for manufacturing a semiconductor device.
Figure 7B:
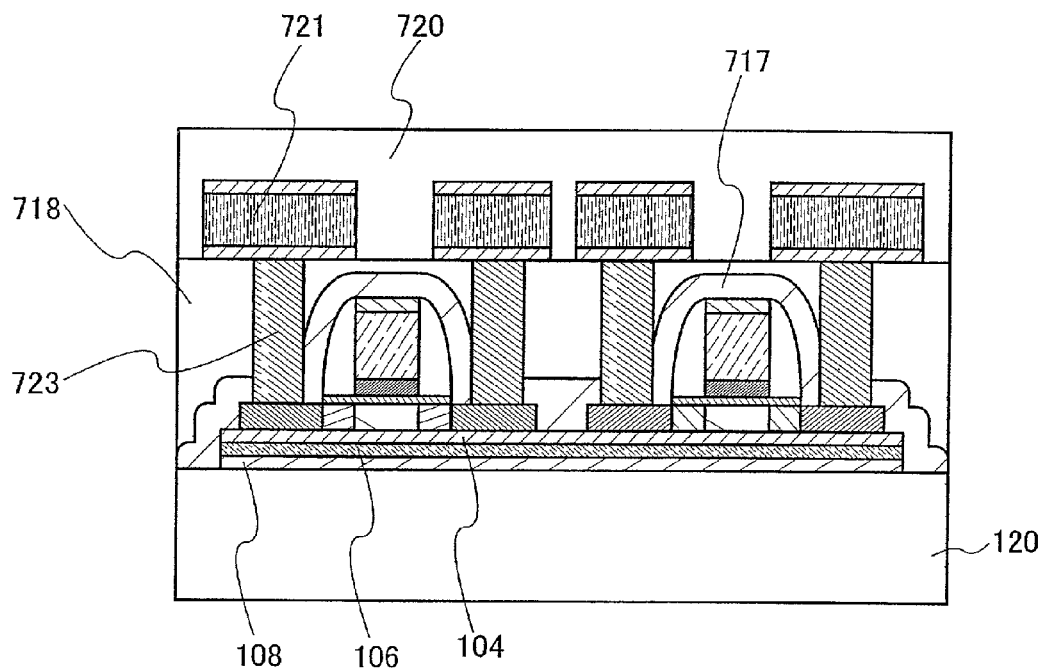

Next, a protective film 717 is formed so as to cover the gate electrode 712 and the like provided for the substrate for manufacturing a semiconductor device (see FIG. 6D). As the protective film 717, it is preferable to form a silicon nitride film or a silicon nitride oxide film by a plasma CVD method at a substrate temperature of 350° C. or lower in forming the film. With forming the protective film 717 in such a manner, the protective film 717 can contain hydrogen. After forming the protective film 717, heat treatment at 350 to 450° C. inclusive (preferably 400 to 420° C. inclusive) is performed, whereby hydrogen in the protective film 717 can be diffused to the semiconductor film 140 side. The semiconductor film 140 is dehydrogenated in a step of manufacturing the substrate for manufacturing a semiconductor device; and defects that can serve as trapping centers can be compensated effectively by supplying hydrogen, which compensates defects during an element formation step, from the protective film 717. Further, the silicon nitride film 106 has an effect of preventing metal impurities from being diffused from the supporting substrate 120 side, while the protective film 717 has an effect of preventing contamination with metal impurities from an upper layer side. In this mode, a bottom side and a top side of the semiconductor film 140 with excellent crystallinity are each covered with an insulating film with a high blocking property against highly mobile metal impurities such as sodium. Thus, an enormous effect can be produced for improving the electric characteristics of the semiconductor elements manufactured using the semiconductor film 140.

Subsequently, an interlayer insulating film 718 is formed over the protective film 717. As the interlayer insulating film 718, a boron phosphorus silicon glass (BPSG) film may be formed or an organic resin typified by polyimide may be formed by coating. In the interlayer insulating film 718, contact holes 719 are formed (see FIG. 7A).

Next, a step of forming a wiring is illustrated. Contact plugs 723 are formed in the contact holes 719. As the contact plugs 723, tungsten silicide is formed by a CVD method using a $WF_6$ gas and a $SiH_4$ gas to fill the contact holes 719. Alternatively, tungsten may be formed by hydrogen reduction of $WF_6$ to fill the contact holes 719. After that, a wiring 721 is formed so as to match the contact plugs 723. The wiring 721 is formed using aluminum or an aluminum alloy, and an upper layer and a lower layer thereof are formed using metal films of molybdenum, chromium, titanium, or the like as barrier metal. Furthermore, an interlayer insulating film 720 is formed thereover (see FIG. 7B). The wiring may be provided as appropriate, and a multilayer wiring may be formed by further forming a wiring layer thereover. In this case, a damascene process may be employed.

In the above manner, a field-effect transistor can be manufactured using a substrate for manufacturing a semiconductor device which includes a semiconductor film fixed over a supporting substrate with a silicon oxide film, a silicon nitride film, and a silicon oxide film interposed therebetween. A substrate for manufacturing a semiconductor device according to the present invention has improved electric characteristics, and thus a field-effect transistor with excellent operation characteristics can be provided. Further, a silicon nitride film, which has a high blocking property against metal impurities, is formed between the semiconductor film and the supporting substrate, and thus a semiconductor device with high reliability can be manufactured. Further, employment of the present invention enables the semiconductor film 140 to be formed using a single-crystalline semiconductor, so that high performance can be achieved in the semiconductor device.

This embodiment mode can be combined as appropriate with another embodiment mode shown in this specification.

Embodiment Mode 3

This embodiment mode describes an example in which a semiconductor device with a different structure from Embodiment Mode 2 is manufactured, with reference to FIGS. 8A to 10B.

Figure 8A:
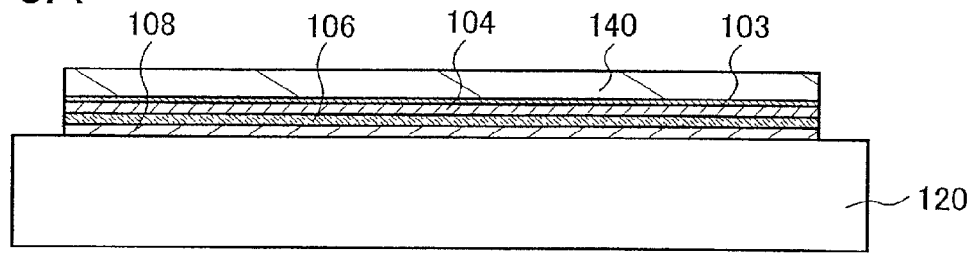
FIGS. 8A to 8E are diagrams showing an example of a method for manufacturing a semiconductor device using a substrate for manufacturing a semiconductor device.

A substrate for manufacturing a semiconductor device is prepared (see FIG. 8A). This mode shows an example in which a substrate for manufacturing a semiconductor device with an SOI structure in which the semiconductor film 140 is fixed over the supporting substrate 120 with the stacked second silicon oxide film 108, the silicon nitride film 106, the first silicon oxide film 104, and the thermal oxide film 103 interposed therebetween as shown in FIG. 5G is used. The present invention does not have any particular limitation, and a substrate for manufacturing a semiconductor device with another structure shown in this specification can be employed.

The semiconductor film 140 has a thickness of 5 to 500 nm inclusive, preferably 10 to 200 nm inclusive, more preferably 10 to 60 nm inclusive. The thickness of the semiconductor film 140 can be set as appropriate by controlling the depth at which the weakened layer 112, which is described in the above embodiment mode, is formed. Further, the semiconductor film 140 of the substrate for manufacturing a semiconductor device may be thinned by etching or the like to a desired thickness. The semiconductor film 140 can be thinned by dry etching using a chlorine-based gas such as $Cl_2$, $BCl_3$, or $SiCl_4$, a fluorine-based gas such as $CF_4$, $NF_3$, or $SF_6$, a HBr gas, or the like. It is also possible to partly change the semiconductor film 140 in quality by oxidation treatment, nitridation treatment, or the like and etch the quality-changed portion selectively.

Figure 8B:
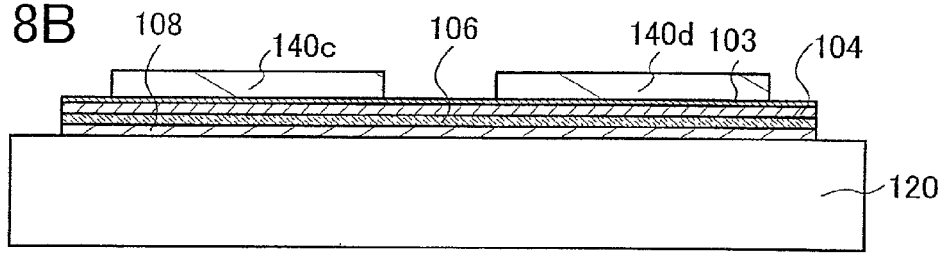

Next, the semiconductor film 140 is etched selectively to fond semiconductor films 140c and 140d, which are separated in island shapes in accordance with a placement of semiconductor elements (see FIG. 8B).

Figure 8C:
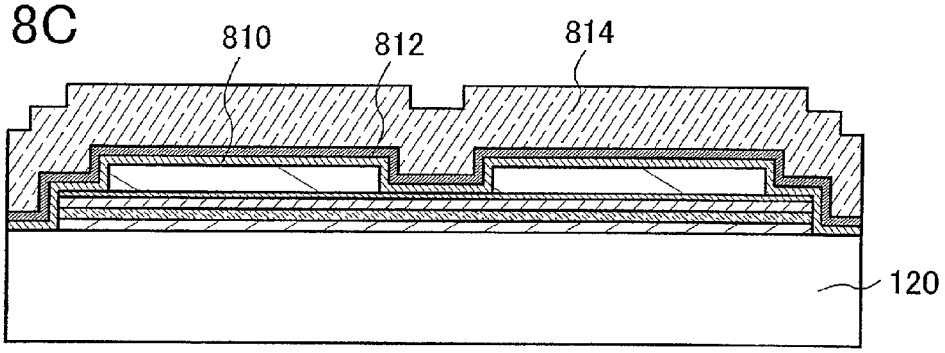

Next, a gate insulating film 810 and conductive films 812 and 814 for forming a gate electrode are formed over the semiconductor film 140c and the semiconductor film 140d (see FIG. 8C).

The gate insulating film 810 is formed with a single layer or stacked layers using an insulating film such as a silicon oxide film, a silicon oxynitride film, a silicon nitride film, or a silicon nitride oxide film by a CVD method, a sputtering method, an atomic layer epitaxy (ALE) method, or the like.

Further, the gate insulating film 810 may be formed by performing plasma treatment to the semiconductor films 140c and 140d to oxidize or nitride surfaces thereof. Plasma treatment in this case also includes that with plasma excited using microwaves (a typical frequency is 2.45 GHz). For example, treatment with plasma that is excited by microwaves and has an electron density of $1\times10^{11}$ to $1\times10^{13}$/cm$^3$ inclusive and an electron temperature of 0.5 to 1.5 eV inclusive is also included. A thin and dense film can be formed by oxidation treatment or nitridation treatment to a surface of a semiconductor film with application of such plasma treatment. Further, the film can have excellent interface characteristics because the surface of the semiconductor film is oxidized directly. Furthermore, the gate insulating film 810 may also be formed by performing plasma treatment with microwaves to a film formed by a CVD method, a sputtering method, or an atomic layer epitaxy (ALE) method.

For the gate insulating film 810, it is preferable that a silicon oxide film or a silicon oxynitride film be an interface because the gate insulating film 810 forms the interface with the semiconductor films. The reason is that formation of a film with a higher nitrogen content than oxygen, such as a silicon nitride film or a silicon nitride oxide film, can raise the trap density to cause a problem of interface characteristics.

The gate electrode is formed by a CVD method or a sputtering method with a single layer or stacked layers using an element selected from tantalum, tantalum nitride, tungsten, titanium, molybdenum, aluminum, copper, chromium, niobium, or the like, an alloy or compound material containing the above element as a main component, or a semiconductor material typified by polycrystalline silicon doped with an impurity element such as phosphorus. In a case where the gate electrode has a stacked-layer structure, the stacked layers can be formed using various conductive materials or one conductive material. This mode illustrates an example in which the first conductive film 812 and the second conductive film 814 form the gate electrode.

If the conductive film for forming the gate electrode has a two-layer structure of the first conductive film 812 and the second conductive film 814, stacked layers of a tantalum nitride film and a tungsten film, a tungsten nitride film and a tungsten film, or a molybdenum nitride film and a molybdenum film can be formed, for example. In the stacked two layers shown above as examples, it is preferable to form the former film on the gate insulating film 810. In this embodiment mode, the first conductive film 812 is formed with a thickness of 20 to 100 nm inclusive. The second conductive film 814 is formed with a thickness of 100 to 400 nm inclusive. The gate electrode can also have a stacked-layer structure of three or more layers; in that case, it is preferable to employ a stacked-layer structure of a molybdenum film, an aluminum film, and a molybdenum film.

Next, resist masks 820c and 820d are formed selectively on the second conductive film 814. Then, first etching treatment and second etching treatment is performed using the resist masks 820c and 820d.

Figure 8D:
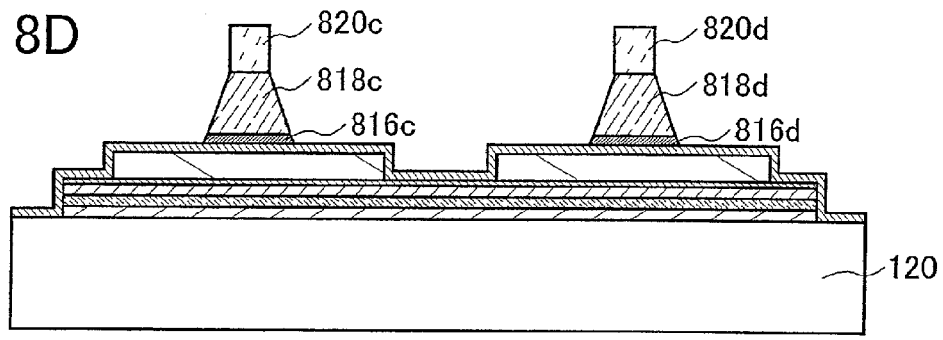

First, in the first etching treatment, the first conductive film 812 and the second conductive film 814 are etched selectively to form a first conductive film 816c and a second conductive film 818c over the semiconductor film 140c, and a first conductive film 816d and a second conductive film 818d over the semiconductor film 140d (see FIG. 8D).

Figure 8E:
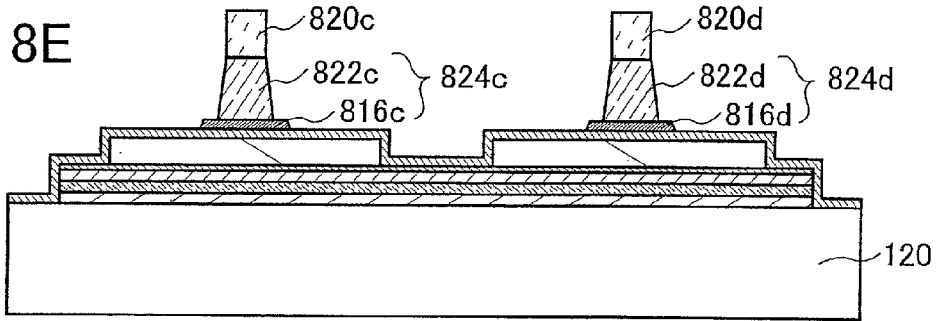
Figure 9A:
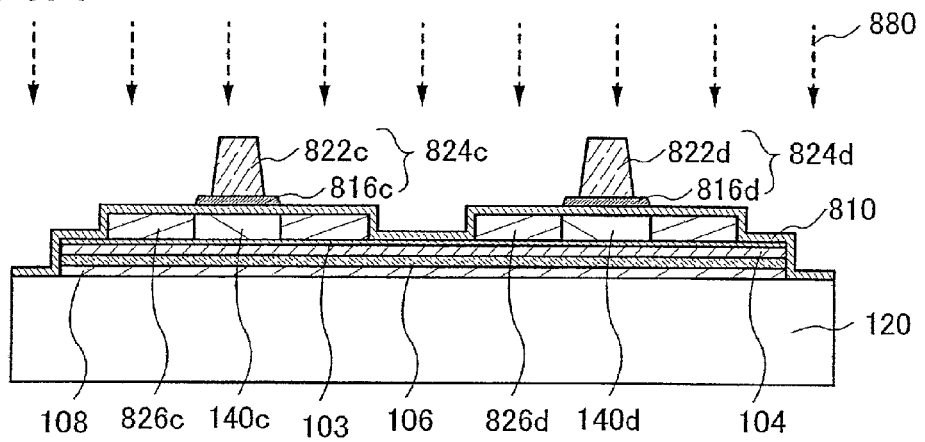
FIGS. 9A to 9C are diagrams showing an example of a method for manufacturing a semiconductor device using a substrate for manufacturing a semiconductor device.
Figure 9B:
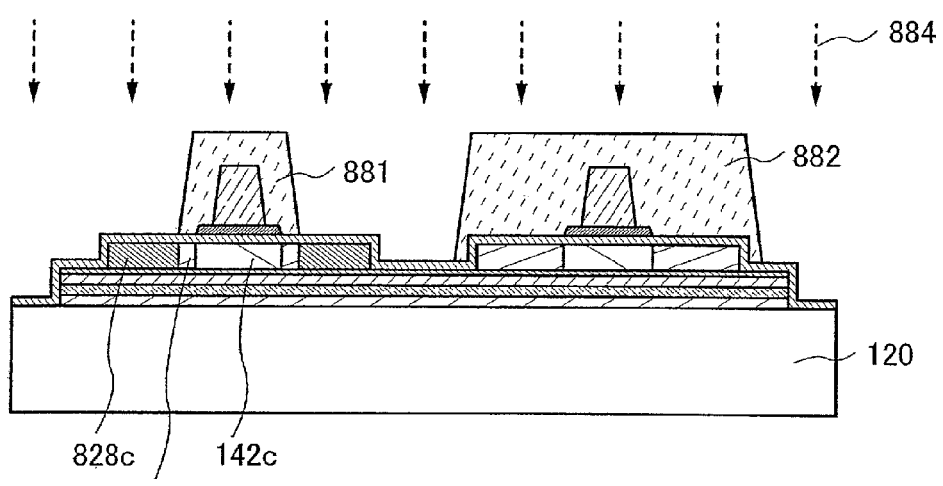
Figure 9C:
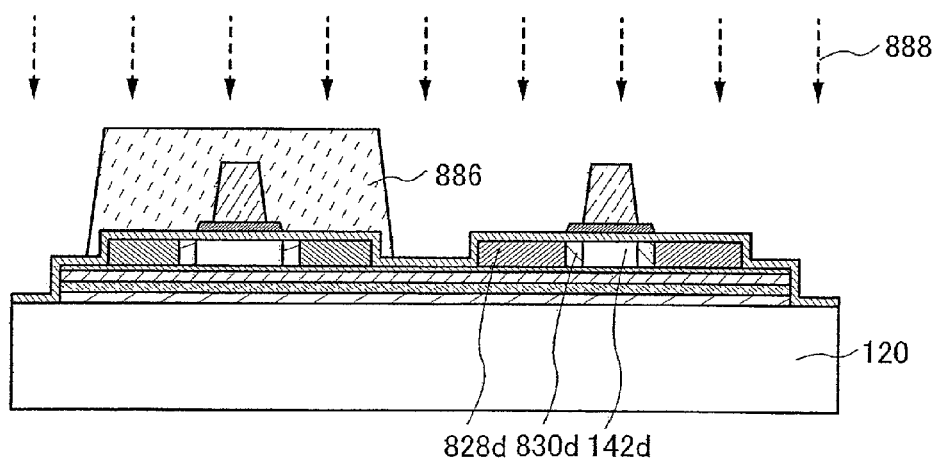

Subsequently, in the second etching treatment, end portions of the second conductive film 816c and the second conductive film 816d are etched selectively to form a second conductive film 822c and a second conductive film 822d (see FIG. 8E). The second conductive films 822c and 822d are formed so as to have smaller widths (lengths parallel to a direction in which carriers flow through channel formation regions (a direction in which a source region and a drain region are connected)) than those of the first conductive films 816c and 816d. In such a manner, a gate electrode 824c including the first conductive film 816c and the second conductive film 822c, and a gate electrode 824d including the first conductive film 816d and the second conductive film 822d can be obtained.

The etching method applied to the first etching treatment and the second etching method may be determined as appropriate; preferably, a dry etching apparatus using a high-density plasma source by an electron cyclotron resonance (ECR) method, an inductively coupled plasma (ICP) method, or the like is used in order to improve the etching rate. With appropriate control of the etching condition of the first etching treatment and the second etching treatment, the first conductive films 816c and 816d and the second conductive films 822c and 822d can each have a desired tapered shape at a side face. After forming the gate electrodes 824c and 824d with desired shapes, the resist masks 820c and 820d may be removed.

Subsequently, an impurity element 880 is added into the semiconductor films 140c and 140d using the gate electrodes 824c and 824d as masks. In the semiconductor film 140c, a pair of first impurity regions 826c are formed in a self-aligned manner using the first conductive film 816c and the second conductive film 822c as masks. In the semiconductor film 140d, a pair of first impurity regions 826d are formed in a self-aligned manner using the first conductive film 816d and the second conductive film 822d as masks (see FIG. 9A).

As the impurity element 880, a p-type impurity element such as boron, aluminum, or gallium, or an n-type impurity element such as phosphorus or arsenic is added. Here, phosphorus, which is an n-type impurity element, is added so as to be contained at a concentration of about $1 \times 10^{17}$ to $5 \times 10^{18}$ atoms/cm$^3$ inclusive.

Subsequently, a resist mask 882 is formed selectively so as to cover the semiconductor film 140d. Further, a resist mask 881 is formed so as to cover the semiconductor film 140c partly. Then, an impurity element 884 is added using the resist masks 882 and 881 as masks, whereby a pair of second impurity regions 828c, a pair of third impurity regions 830c, and a channel formation region 142c are formed in the semiconductor film 140c (see FIG. 9B).

As the impurity element 884, a p-type impurity element such as boron, aluminum, or gallium, or an n-type impurity element such as phosphorus or arsenic is added. Here, phosphorus, which is an n-type impurity element, is added so as to be contained at a concentration of about $5 \times 10^{19}$ to $5 \times 10^{20}$ atoms/cm$^3$ inclusive.

In the semiconductor film 140c, the second impurity regions 828c are formed in regions which do not overlap with the first conductive film 816c and the second conductive film 822c. The channel formation region 142c is formed in a region which overlaps with the first conductive film 816c and the second conductive film 822c. The third impurity regions 830c are formed in regions which are located between the channel formation region 142c and the second impurity regions 828c and overlap with neither the first conductive film 816c nor the second conductive film 822c. Further, the third impurity regions 830c are located in regions which overlap with neither the first conductive film 816c nor the second conductive film 822c but overlap with the resist mask 881. The second impurity regions 828c function as a source region and a drain region. The third impurity regions 830c function as LDD regions. In this mode, the second impurity regions 828c have higher impurity concentrations than the third impurity regions 830c.

An LDD region means a region to which an impurity element is added at a low concentration and which is formed between a channel formation region and a source or drain region that is formed by adding the impurity element at a high concentration. Forming an LDD region has an effect of alleviating an electric field near to a drain region, thereby preventing deterioration due to hot carriers. Further, a structure in which an LDD region overlaps with a gate electrode with a gate insulating film interposed therebetween (also called a "gate-drain overlapped LDD (GOLD) structure") may also be employed in order to prevent deterioration of an on-current value due to hot carriers.

Subsequently, the resist masks 881 and 882 are removed, and then a resist mask 886 is formed so as to cover the semiconductor film 140c. An impurity element 888 is added using the resist mask 886, the first conductive film 816d, and the second conductive film 822d as masks, whereby a pair of second impurity regions 828d, a pair of third impurity regions 830d, and a channel formation region 142d are formed in the semiconductor film 140d (see FIG. 9C).

As the impurity element 888, a p-type impurity element such as boron, aluminum, or gallium, or an n-type impurity element such as phosphorus or arsenic is added. Here, boron, which is a p-type impurity element, is added so as to be contained at a concentration of about $1 \times 10^{20}$ to $5 \times 10^{21}$ atoms/cm$^3$ inclusive.

In the semiconductor film 140d, the second impurity regions 828d are formed in regions which overlap with neither the first conductive film 816d nor the second conductive film 822d. The third impurity regions 830d are formed in regions which overlap with the first conductive film 816d and do not overlap with the second conductive film 822d, by penetration of the impurity element 888 through the first conductive film 816d. The second impurity regions 828d function as a source region or a drain region. The third impurity regions 830d function as LDD regions. In this mode, the second impurity regions 828d have higher impurity concentrations than the third impurity regions 830d.

Subsequently, an interlayer insulating film is formed. The interlayer insulating film can be formed with a single layer or stacked layers; in this embodiment mode, the interlayer insulating film has a two-layer structure of an insulating film 832 and an insulating film 834 (see FIG. 10A).

As the interlayer insulating film, a silicon oxide film, a silicon oxynitride film, a silicon nitride film, a silicon nitride oxide film, or the like can be formed by a CVD method or a sputtering method. Further, the interlayer insulating film can also be formed by an application method such as a spin coating method, using an organic material such as polyimide, polyamide, polyvinylphenol, benzocyclobutene, acrylic, or epoxy, a siloxane material such as a siloxane resin, an oxazole resin, or the like. A siloxane material corresponds to a material having Si—O—Si bonds. Siloxane includes a skeleton structure of a bond of silicon (Si) and oxygen (O). As a substituent, an organic group containing at least hydrogen (e.g., an alkyl group or aromatic hydrocarbon) is used. Alternatively, a fluoro group, or a fluoro group and an organic group containing at least hydrogen can also be used as a substituent. Examples of an oxazole resin include photosensitive polybenzoxazole and the like. Photosensitive polybenzoxazole has a low dielectric constant (a dielectric constant of 2.9 at room temperature and at 1 MHz), high heat resistance (a thermal decomposition temperature of 550° C. at a temperature rise of 5° C./min. in thermogravimetry-differential thermal analysis (TG/DTA)), and a low water absorption rate (0.3 wt % at room temperature for 24 hours). An oxazole resin suppresses generation of parasitic capacitance and thus enables high speed operation because it has a lower dielectric constant (about 2.9) compared with that of polyimide (about 3.2 to 3.4) or the like.

In this mode, a silicon nitride oxide film is formed with a thickness of 100 nm as the insulating film 832, and a silicon oxynitride film is formed with a thickness of 900 nm as the insulating film 834. The insulating films 832 and 834 are formed successively by a plasma CVD method. The interlayer insulating film may also have a stacked-layer structure including three or more layers. Further, the interlayer insulating film may also have a stacked-layer structure including a silicon oxide film, a silicon oxynitride film, or a silicon nitride film, and an insulating film formed using an organic material such as polyimide, polyamide, polyvinylphenol, benzocyclobutene, acrylic, or epoxy, a siloxane material such as a siloxane resin, or an oxazole resin.

Figure 10A:
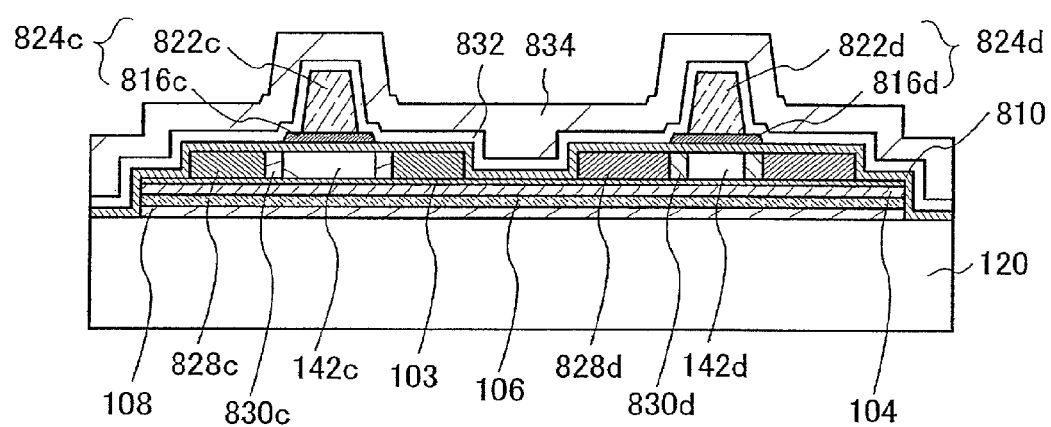
FIGS. 10A and 10B are diagrams showing an example of a method for manufacturing a semiconductor device using a substrate for manufacturing a semiconductor device.
Figure 10B:
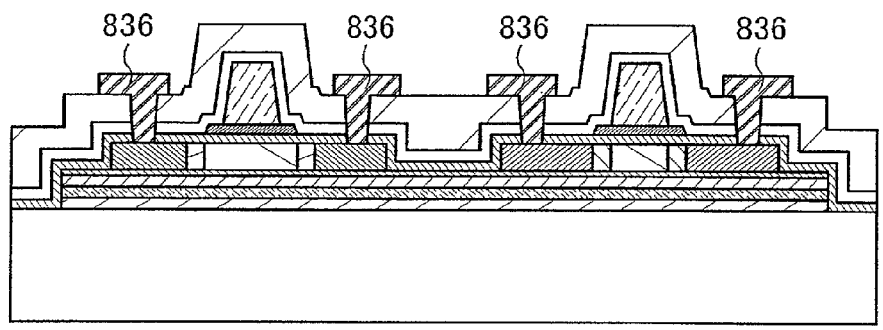

Subsequently, contact holes are formed in the interlayer insulating film (in this mode, the insulating films 832 and 834), and conductive films 836 that function as a source electrode and a drain electrode are formed in the contact holes (see FIG. 10B).

The contact holes are formed selectively in the insulating films 832 and 834 so as to reach the second impurity regions 828c in the semiconductor film 140c and the second impurity regions 828d in the semiconductor film 140d.

As the conductive films 836, a single layer formed of one element selected from aluminum, tungsten, titanium, tantalum, molybdenum, nickel, or neodymium, or an alloy containing a plurality of above elements; or stacked layers of such layers can be used. As a conductive film formed of an alloy containing the plurality of above elements, an aluminum alloy film containing titanium, an aluminum alloy film containing neodymium, or the like can be formed, for example. If the conductive films 836 have a stacked-layer structure, a structure can be employed in which an aluminum film or an aluminum alloy film as described above is sandwiched between titanium films, for example.

In the above manner, a field-effect transistor can be manufactured using a substrate for manufacturing a semiconductor device which includes a semiconductor film fixed over a supporting substrate with a silicon oxide film, a silicon nitride film, and a silicon oxide film interposed therebetween. A substrate for manufacturing a semiconductor device according to the present invention is devised with an electric characteristics improvement of the semiconductor device using the substrate in mind, and thus a field-effect transistor with excellent operation characteristics can be provided. Further, a silicon nitride film, which has a high blocking property against metal impurities, is formed between the semiconductor film and the supporting substrate, and thus a semiconductor device with high reliability can be manufactured. Further, employment of the present invention enables the semiconductor film 140 to be formed using a single-crystalline semiconductor, so that high performance can be achieved in the semiconductor device.

This embodiment mode can be combined as appropriate with another embodiment mode shown in this specification.

Embodiment Mode 4

This embodiment mode illustrates an example of a semiconductor device to which a substrate for manufacturing a semiconductor device according to the present invention is applied.

Figure 11:
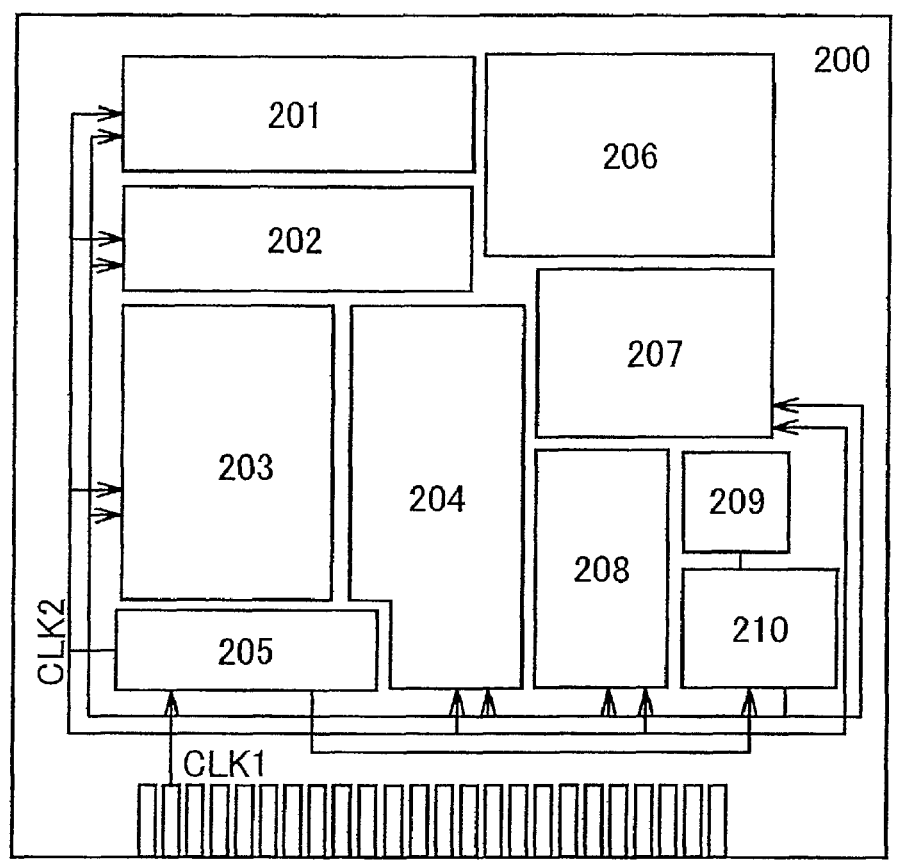
FIG. 11 is a block diagram showing a configuration of a microprocessor which can be obtained using a substrate for manufacturing a semiconductor device.

FIG. 11 illustrates an example of a microprocessor 200 as an example of a semiconductor device. The microprocessor 200 is manufactured with employment of a substrate for manufacturing a semiconductor device according to the above embodiment modes. The microprocessor 200 includes an arithmetic logic unit (also referred to as an ALU) 201, an ALU controller 202, an instruction decoder 203, an interrupt controller 204, a timing controller 205, a register 206, a register controller 207, a bus interface (bus I/F) 208, a read only memory 209, and a memory interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 carry out various controls based on the decoded instruction. Specifically, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads or writes data from or to the register 206 in accordance with the state of the microprocessor 200. The timing controller 205 generates signals for controlling timing of operation of the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1, and supplies the clock signal CLK2 to the above various circuits. The microprocessor 200 shown in FIG. 11 is merely an example with a simplified configuration, and an actual microprocessor may have a variety of configurations depending on the uses.

With use of a substrate for manufacturing a semiconductor device and a semiconductor device according to the above embodiment modes, such a microprocessor 200 has improved electric characteristics and improved reliability, and thus an integrated circuit can be formed with high reliability and excellent characteristics. Further, with use of a single-crystalline semiconductor film, it is possible to form an integrated circuit and also to realize higher performance and higher process speed.

Figure 12:
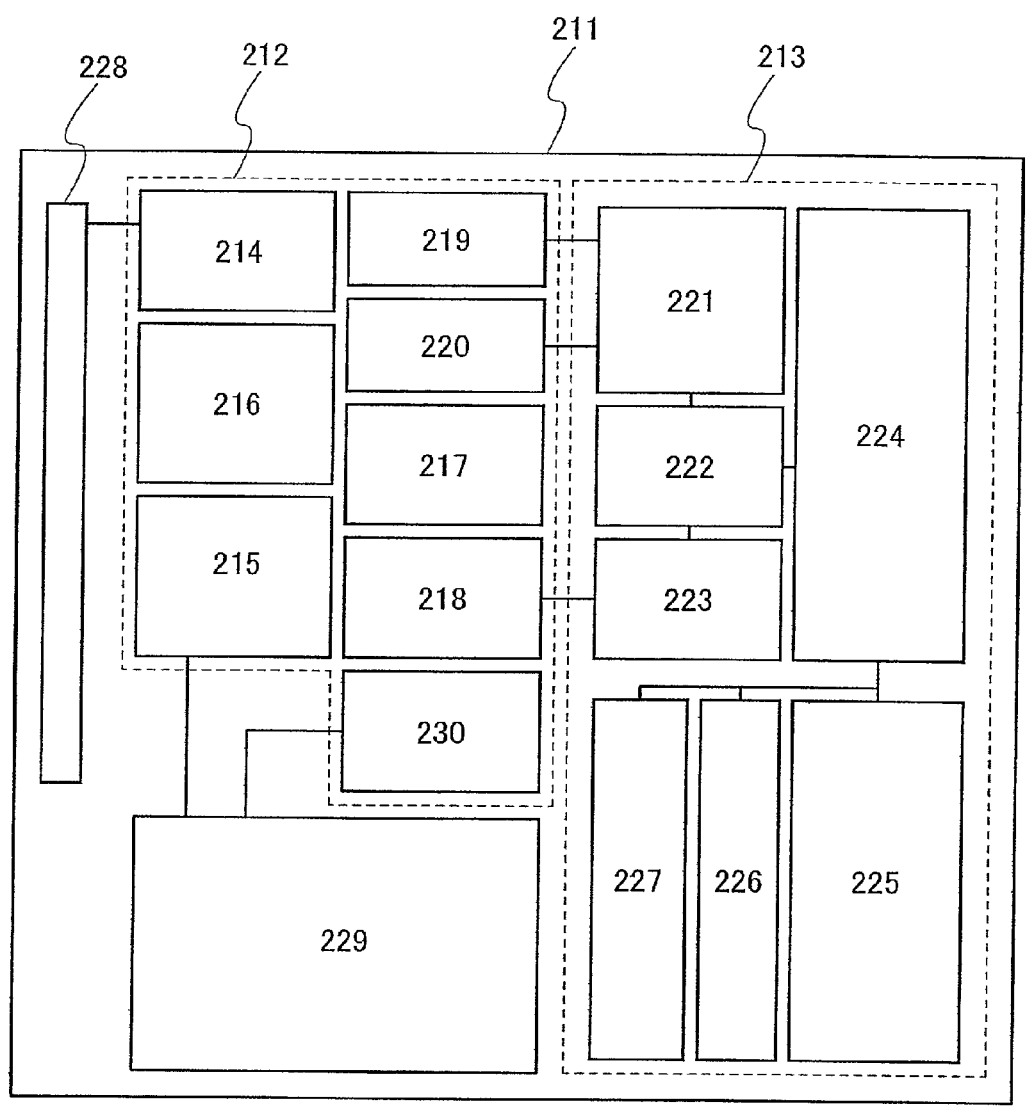
FIG. 12 is a block diagram showing a configuration of an RFCPU which can be obtained using a substrate for manufacturing a semiconductor device.

Next, an example of a semiconductor device having an arithmetic function that enables noncontact data transmission and reception is described with reference to FIG. 12. FIG. 12 shows an example of a computer that operates to transmit and receive signals to and from an external device by wireless communication (such a computer is referred to as an "RFCPU," hereinafter). An RFCPU 211 includes an analog circuit portion 212 and a digital circuit portion 213. The analog circuit portion 212 includes a resonance circuit 214 with a resonance capacitor, a rectifier circuit 215, a constant voltage circuit 216, a reset circuit 217, an oscillator circuit 218, a demodulator circuit 219, and a modulator circuit 220. The digital circuit portion 213 includes an RF interface 221, a control register 222, a clock controller 223, a CPU interface 224, a central processing unit 225, a random-access memory 226, and a read only memory 227.

An operation of the RFCPU 211 having such a configuration is roughly as follows. The resonance circuit 214 generates induced electromotive force based on a signal received by an antenna 228. A capacitor portion 229 is charged with the induced electromotive force through the rectifier circuit 215. This capacitor portion 229 is preferably formed using a capacitor such as a ceramic capacitor or an electric double layer capacitor. The capacitor portion 229 does not need to be integrated with the RFCPU 211 and may be mounted as a separated component on a substrate having an insulating surface that is included in the RFCPU 211.

The reset circuit 217 generates a signal for resetting and initializing the digital circuit portion 213. For example, the reset circuit 217 generates a signal which rises after a rise in the power supply voltage with delay as a reset signal. The oscillator circuit 218 changes the frequency and duty ratio of a clock signal in response to a control signal generated by the constant voltage circuit 216. The demodulator circuit 219 formed using a low-pass filter binarizes the fluctuation in amplitude of, for example, a received signal in an amplitude shift keying (ASK) mode. The modulator circuit 220 varies the amplitude of a transmission signal in an amplitude shift keying (ASK) mode and transmits the signal as transmission data. The modulator circuit 220 changes the amplitude of a communication signal by changing a resonance point of the resonance circuit 214. The clock controller 223 generates a control signal for changing the frequency and duty ratio of a clock signal in accordance with the power supply voltage or a consumption current of the central processing unit 225. The power supply voltage is managed by a power management circuit 230.

A signal input from the antenna 228 to the RFCPU 211 is demodulated by the demodulator circuit 219 and then decomposed into a control command, data, and the like by the RF interface 221. The control command is stored in the control register 222. The control command includes reading of data stored in the read only memory 227, writing of data to the random-access memory 226, an arithmetic instruction to the central processing unit 225, and the like. The central processing unit 225 accesses the read only memory 227, the random-access memory 226, and the control register 222 through the CPU interface 224. The CPU interface 224 has a function of generating an access signal to any of the read only memory 227, the random-access memory 226, and the control register 222, based on an address requested by the central processing unit 225.

As an arithmetic method of the central processing unit 225, a method may be employed in which the read only memory 227 stores an operating system (OS) and a program is read and executed at the time of startup. Further, a method may also be employed in which a dedicated arithmetic circuit is provided and arithmetic processing is carried out using hardware. In a method in which both hardware and software are used, part of processing can be carried out by a dedicated arithmetic circuit and the other part of the arithmetic processing can be executed by the central processing unit 225 using a program.

With employment of a substrate for manufacturing a semiconductor device and a semiconductor device according to the above embodiment modes, such an RFCPU 211 has improved electric characteristics and improved reliability, and thus an integrated circuit with high reliability and excellent characteristics can be formed. Further, with use of a single-crystalline semiconductor film, it is possible to form an integrated circuit and also to realize higher performance and higher process speed. Although FIG. 12 illustrates a mode of an RFCPU, it is also possible to employ a mode of an IC tag or the like as long as it has functions of communication, arithmetic process, and memory.

Figure 13:
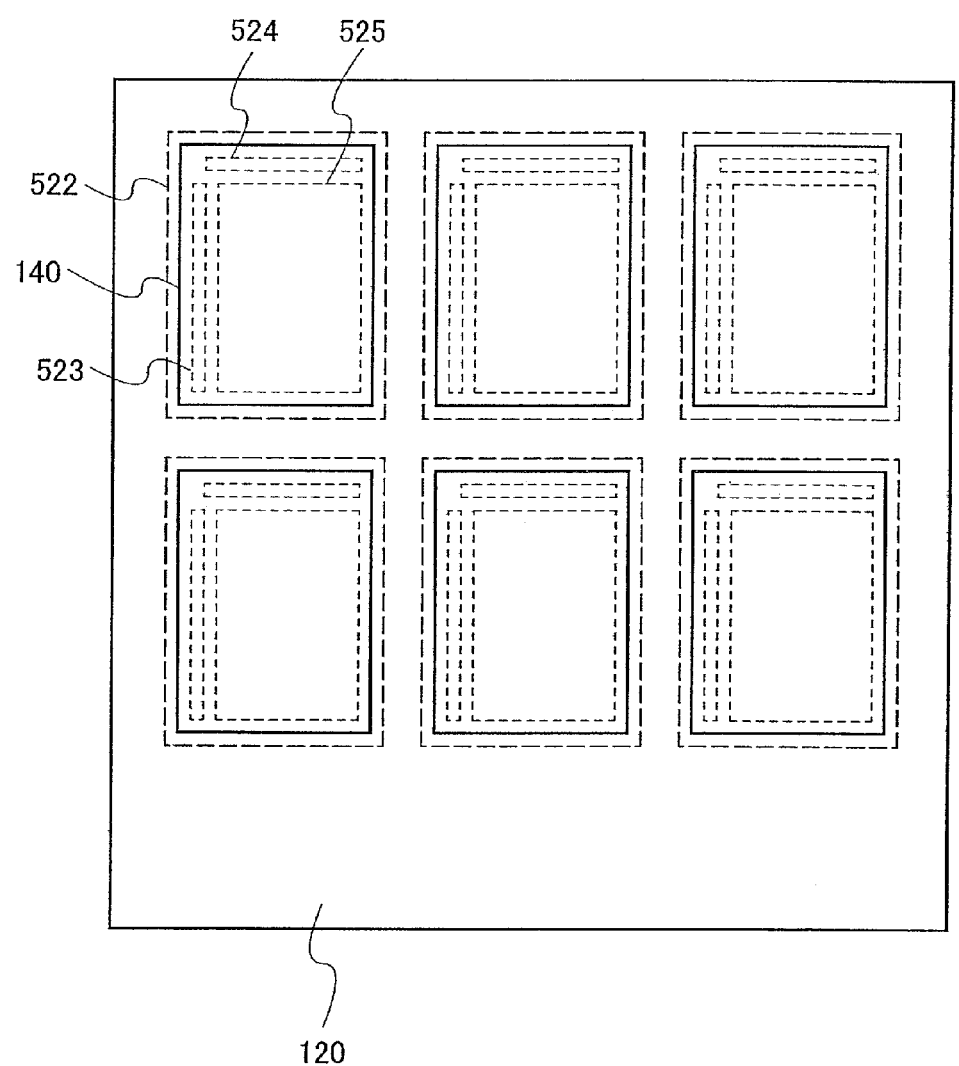
FIG. 13 is a diagram showing an example in which semiconductor films are bonded to a mother glass for manufacturing display panels.

A substrate for manufacturing a semiconductor device according to the present invention can also be formed by using a large-sized glass substrate called "mother glass" for manufacturing a display panel as a supporting substrate, and bonding a semiconductor film to the large-sized glass substrate. FIG. 13 shows a case where a semiconductor film 140 is bonded to mother glass used as a supporting substrate 120. A plurality of display panels are cut out of the mother glass, and the semiconductor film 140 is preferably bonded to match a formation region of a display panel 522. As shown in FIG. 13, it is preferable that a plurality of semiconductor films 140 be placed within the formation regions of the display panels 522 because a mother glass substrate has a larger area than a semiconductor substrate. Thus, the number of display panels that can be manufactured using one base substrate increases, so that productivity is improved dramatically. Each of the display panels 522 includes a scan line driver circuit region 523, a signal line driver circuit region 524, and a pixel formation region 525. The semiconductor film 140 is bonded to the supporting substrate 120 so that the display panel 522 can include these regions.

A large-sized glass substrate called "mother glass" has a problem of containing metal impurities such as sodium. In a substrate for manufacturing a semiconductor device according to the present invention, however, a silicon nitride film, which has a high blocking property, is formed between a glass substrate and a semiconductor film, and thus characteristic deterioration of a display panel or the like can be prevented and reliability can also be improved.

Figure 14A:
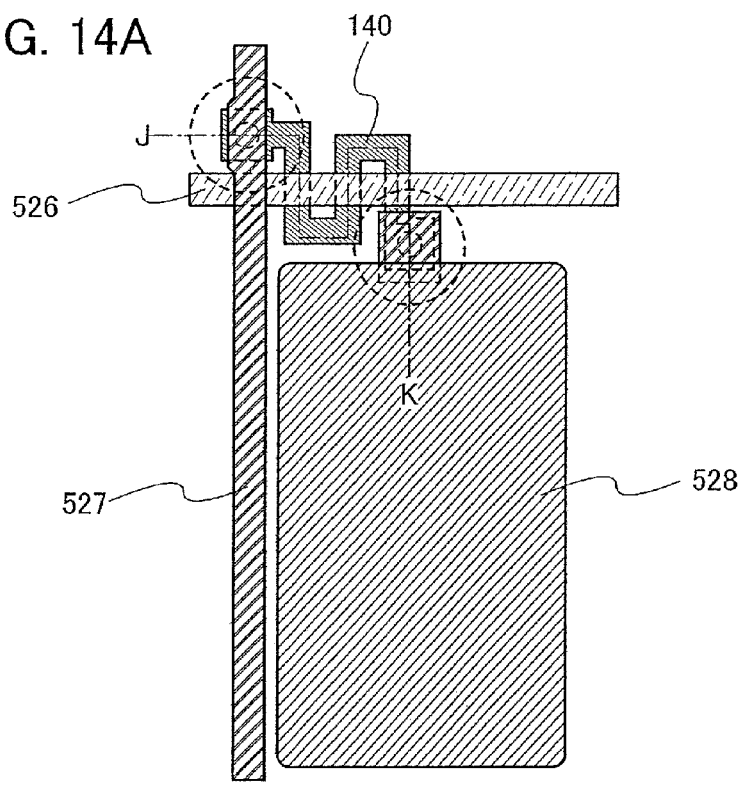
FIGS. 14A and 14B are diagrams showing an example of a liquid crystal display device.
Figure 14B:
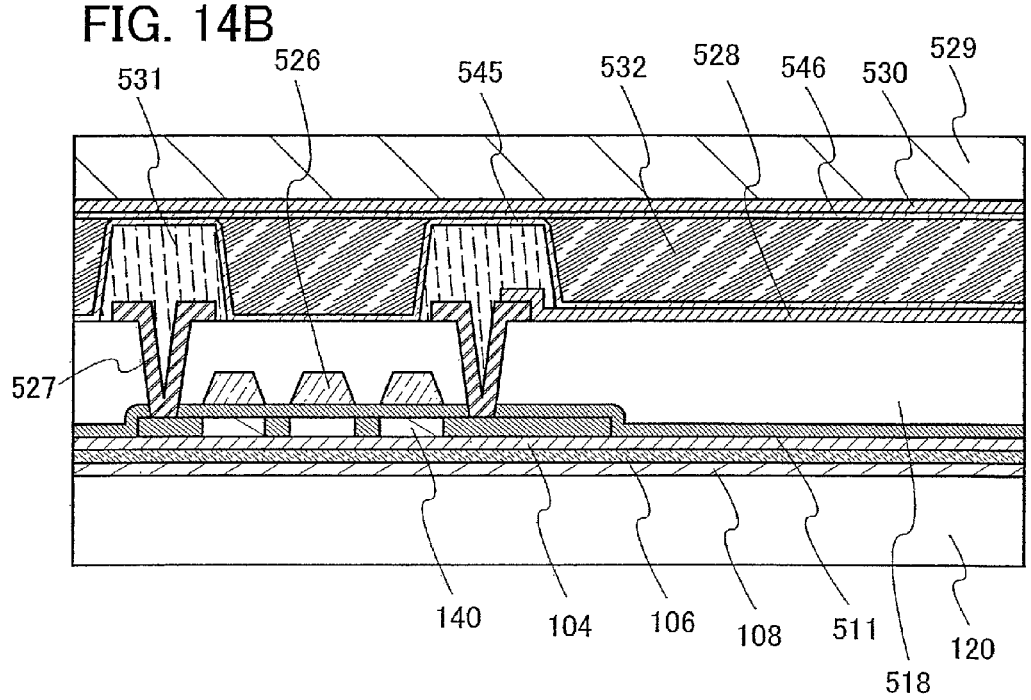

FIGS. 14A and 14B illustrate an example of a pixel of a liquid crystal display device to which a substrate for manufacturing a semiconductor device according to the present invention is applied and in which a transistor of a pixel portion is formed using a semiconductor film of the substrate for manufacturing a semiconductor device. FIG. 14A is a plan view of a pixel, in which a scan line 526 intersects a semiconductor film, and a signal line 527 and a pixel electrode 528 are connected to the semiconductor film FIG. 14B is a cross-sectional view of FIG. 14A taken along a chain line J-K.

In FIG. 14B, there is a region having a structure in which a semiconductor film 140 is stacked over a supporting substrate 120 with a second silicon oxide film 108, a silicon nitride film 106, and a first silicon oxide film 104, which are stacked in this order, interposed therebetween. A pixel transistor of this embodiment mode includes the above region. 511 denotes a gate insulating film. In this mode, the semiconductor film 140 is a single-crystalline semiconductor film. The pixel electrode 528 is provided over an interlayer insulating film 518. Contact holes that connect the semiconductor film 140 and the signal line 527 are formed in the interlayer insulating film 518. Columnar spacers 531 are provided over the signal line 527 so as to fill hollows due to the contact holes formed in the interlayer insulating film 518. A counter substrate 529 is provided with a counter electrode 530, and a liquid crystal 532 sandwiched between alignment films 545 and 546 is formed in a space formed with the columnar spacers 531. A polarizing plate is provided as appropriate for an outside of the supporting substrate 120 or the counter substrate 529 although not shown in the diagram.

The interlayer insulating film 518 can be formed with a single layer or stacked layers. As the interlayer insulating film 518, it is preferable to form a planarization film, which planarizes roughness due to a structure such as a transistor that is formed in a lower layer, and can form a planar surface. For example, the interlayer insulating film 518 can be formed by an application method such as a spin coating method, using an organic material such as polyimide, polyamide, polyvinylphenol, benzocyclobutene, acrylic, or epoxy, a siloxane material such as a siloxane resin, an oxazole resin, or the like. As the interlayer insulating film 518, a BPSG film may also be formed. Further, it is also possible to form an insulating film such as a silicon oxide film, a silicon nitride film, a silicon oxynitride film, or a silicon nitride oxide film by a CVD method or a sputtering method. Furthermore, it is also possible to stack an insulating film formed using an organic material and an insulating film formed using an inorganic material.

The pixel electrode 528 may be formed using a reflective conductive material if the liquid crystal display device is a reflective type. As such a material, a metal element such as tantalum, tungsten, titanium, molybdenum, aluminum, chromium, or silver, or an alloy or compound material containing the above metal element can be used. If another reflective film is formed in addition to the pixel electrode 528 or if the liquid crystal display device is a transmissive type, the pixel electrode 528 may be formed using a conductive material which transmits light. As a conductive material which transmits light, indium tin oxide (ITO), zinc oxide (ZnO), indium zinc oxide (IZO), zinc oxide to which gallium is added (GZO), or the like can be used.

Further, the pixel electrode 528 can be formed using a conductive composition including a conductive high molecule (also referred to as a conductive polymer). It is preferable that a pixel electrode formed using a conductive composition have sheet resistance of 10000 O/square or less in a form of a thin film, and light transmittance of 70% or more at a wavelength of 550 nm. Further, it is preferable that a conductive high molecule included in a conductive composition have resistance of 0.1 O·cm or lower.

As a conductive high molecule, so-called a "π electron conjugated conductive high molecule" can be used. For example, polyaniline or a derivative thereof, polypyrrole or a derivative thereof, polythiophene or a derivative thereof, or a copolymer of two or more kinds of those materials can be given.

Specific examples of a conjugated conductive high molecule are as follows: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), or poly (3-anilinesulfonic acid).

The above conductive high molecule may be used alone as a conductive component to form the pixel electrode 528. Further, it is also possible to add an organic resin to a conductive high molecule in order to control the film property, such as the film quality or the film strength, of the pixel electrode formed using a conductive composition.

As an organic resin, a thermosetting resin, a thermoplastic resin, a photocurable resin, or the like which is compatible with, or can be mixed and dispersed into a conductive high molecule can be used. For example, a polyester-based resin such as polyethylene terephthalate, polybutylene terephthalate, or polyethylene naphthalate; a polyimide-based resin such as polyimide or polyimide amide; a polyamide resin such as polyamide 6, polyamide 6, 6, polyamide 12, or polyamide 11; a fluorine resin such as polyvinylidene fluoride, polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin; or a copolymer of any of these resins can be given.

Further, in order to adjust the electrical conductivity of a conductive composition, the conductive composition may be doped with an acceptor dopant or a donor dopant to change the oxidation-reduction potential of a conjugated electron in a conjugated conductive high molecule.

A halogen compound, a Lewis acid, a protonic acid, an organic cyano compound, an organic metal compound, or the like can be used as an acceptor dopant. Examples of a halogen compound include chlorine, bromine, iodine, iodine chloride, iodine bromide, and iodine fluoride. Examples of a Lewis acid include phosphorus pentafluoride, arsenic pentafluoride, antimony pentafluoride, boron trifluoride, boron trichloride, and boron tribromide. Examples of a protonic acid include an inorganic acid such as hydrochloric acid, sulfuric acid, nitric acid, phosphoric acid, fluoroboric acid, hydrofluoric acid, and perchloric acid; and an organic acid such as organic carboxylic acid and organic sulfonic acid. As organic carboxylic acid and organic sulfonic acid, carboxylic acid compound and a sulfonic acid compound can be used. As an organic cyano compound, a compound having two or more cyano groups in a conjugated bonding, for example, tetracyanoethylene, tetracyanoethylene oxide, tetracyanobenzene, tetracyanoquinodimethane, or tetracyanoazanaphthalene, are given.

As a donor dopant, an alkali metal, an alkaline earth metal, a quaternary amine compound, or the like can be used.

Further, a conductive composition may be dissolved in water or an organic solvent (e.g., an alcohol-based solvent, a ketone-based solvent, an ester-based solvent, a hydrocarbon-based solvent, or an aromatic-based solvent) and a thin film which serves as a pixel electrode can be formed by a wet process.

A solvent which dissolves a conductive composition is not particularly limited. A solvent which dissolves the above conductive high molecules and high molecular resin compounds such as an organic resin may be used. For example, a conductive composition may be dissolved in any one or mixed solvent of water, methanol, ethanol, propylene carbonate, N-methylpyrrolidone, dimethylformamide, dimethylacetamide, cyclohexanone, acetone, methyl ethyl ketone, methyl isobutyl ketone, toluene, or the like.

After the conductive composition is dissolved in a solvent as described above, a film thereof can be formed over the interlayer insulating film 518 by a wet process, such as an application method, a coating method, a droplet discharge method (also referred to as an inkjet method), or a printing method, whereby the pixel electrode 528 can be obtained. The solvent may be dried with heat treatment or under reduced pressure. In a case where the organic resin is a thermosetting resin, heat treatment may be performed. In a case where the organic resin is a photocurable resin, light irradiation treatment may be performed.

The columnar spacers 531 can be obtained by forming an insulating film over an entire surface of the substrate, using an organic material such as epoxy, polyimide, polyamide, polyimide amide, or acrylic, or an inorganic material such as silicon oxide, silicon nitride, silicon oxynitride, or silicon nitride oxide, and then etching the insulating film into a desired form.

For the alignment films 545 and 546, the material may be determined based on an operation mode of liquid crystals, and films which can align the liquid crystals in a uniform direction are formed. For example, a film is formed using polyimide, polyamide, or the like and undergoes alignment treatment, so that the film can function as the alignment film. As the alignment treatment, rubbing or irradiation with an ultraviolet ray or the like may be performed. Although the method for forming the alignment films 545 and 546 is not particularly limited, the alignment films 545 and 546 can be formed selectively if a printing method or a droplet discharge method is used.

The liquid crystal 532 is formed using a desired liquid crystal material. For example, the liquid crystal 532 can be formed by dripping the liquid crystal material into a frame-shaped seal pattern formed with a sealant. The liquid crystal material may be dripped by a dispenser method or a droplet discharge method. It is preferable that the liquid crystal material be degassed under a reduced pressure in advance or after being dripped. Further, it is preferable that the liquid crystal material be dripped in an inert atmosphere so that impurities or the like are not mixed into the liquid crystal material. Furthermore, in order that a bubble or the like may not be formed in the liquid crystal 532, it is preferable that an atmosphere be set under a reduced pressure after forming the liquid crystal 532 by dripping the liquid crystal material and until attaching the supporting substrate 120 and the counter substrate 529 to each other. It is also possible to form the liquid crystal 532 by attaching the supporting substrate 120 and the counter substrate 529 to each other and then injecting the liquid crystal material into the inside of the frame-shaped pattern of the sealant utilizing a capillary phenomenon. In this case, an opening for injecting the liquid crystal is formed in advance in the sealant or the like. It is preferable that the liquid crystal material be injected under a reduced pressure.

For the counter substrate 529, a variety of glass substrates such as an aluminosilicate glass substrate, an aluminoborosilicate glass substrate, or a barium borosilicate glass substrate; a quartz substrate; a ceramic substrate; a sapphire substrate; or the like can be used. If the liquid crystal display device is a reflective type, a substrate which transmits light (concretely, a glass substrate, a quartz substrate, or the like) is used as the counter substrate 529. If the liquid crystal display device is a transmissive type, a substrate which transmits light can be used as the counter substrate 529. The counter electrode 530 and the alignment film 546 may be provided for the counter substrate 529 before the counter substrate 529 is bonded to the supporting substrate 120. Further, a color filter, a black matrix, or the like may be provided for the counter substrate 529.

Figure 15A:
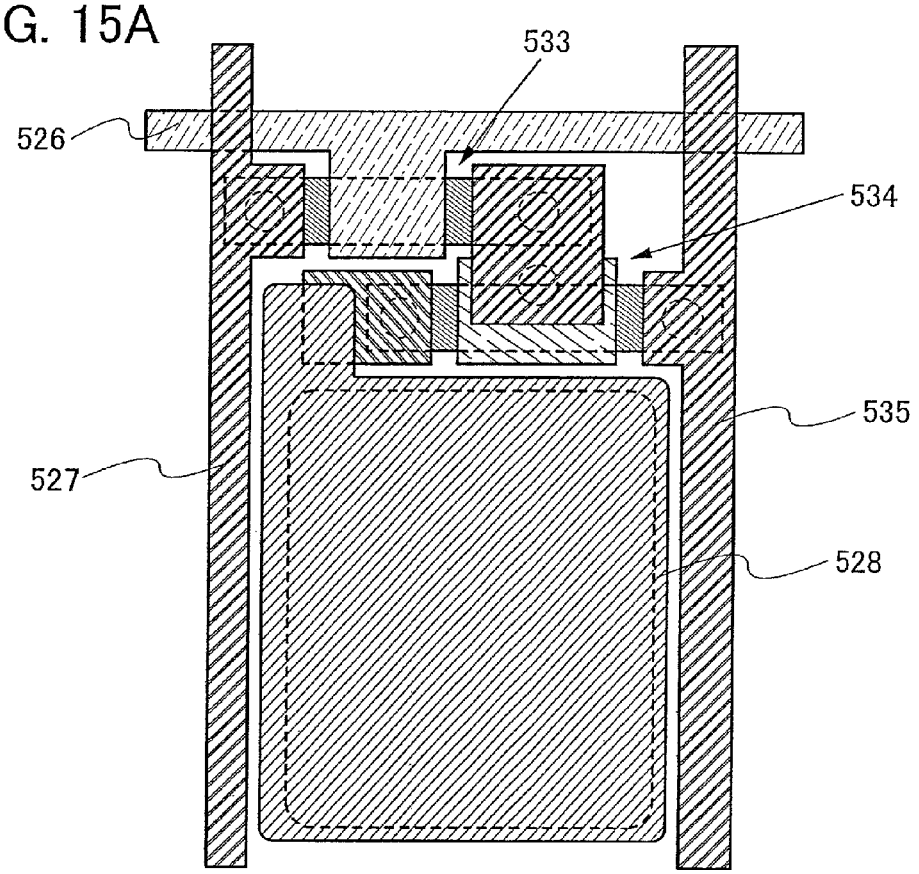
FIGS. 15A and 15B are diagrams showing an example of an electroluminescent display device.
Figure 15B:
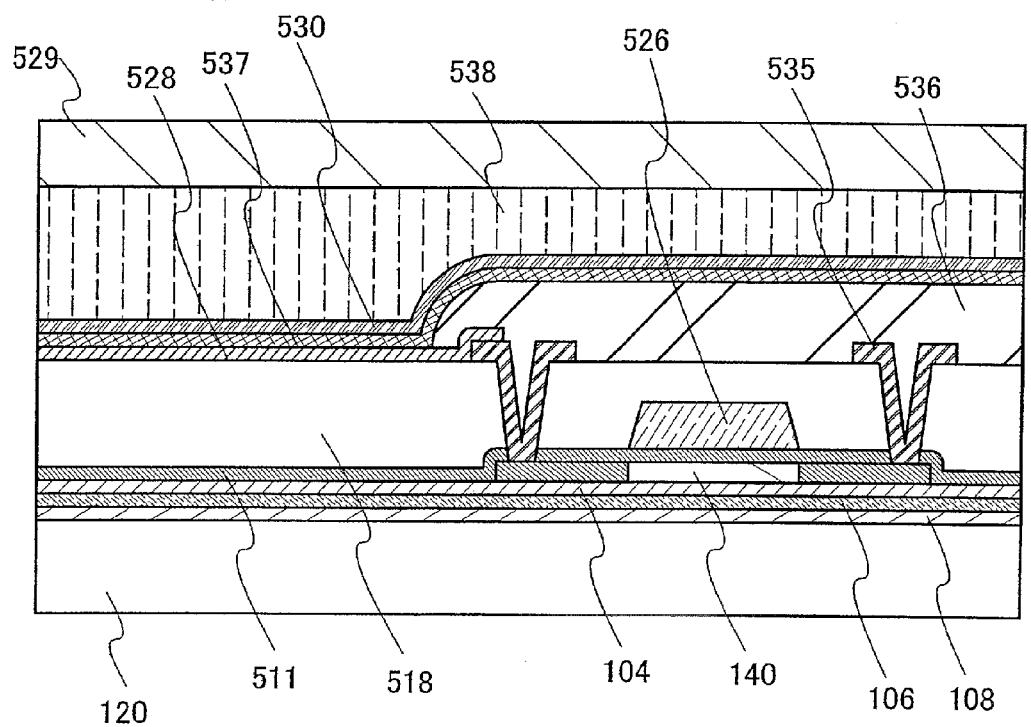

FIG. 15A shows an example of an electroluminescent (EL) display device to which a substrate for manufacturing a semiconductor device according to the present invention is applied and in which a transistor in a pixel portion is formed using a semiconductor film of the substrate for manufacturing a semiconductor device. FIG. 15A is a plan view of a pixel that includes a selection transistor 533 using a scanning line 526 as a gate electrode connected to a signal line 527 and a display control transistor 534 connected to a power supply line 535. In this display device, each pixel is provided with a light-emitting element that includes a layer (EL layer) containing an electroluminescent material between electrodes. A pixel electrode 528 is connected to the display control transistor 534. FIG. 15B is a cross-sectional view showing a main portion of such a pixel.

In FIG. 15B, there is a region that has a structure in which a semiconductor film 140 is stacked over a supporting substrate 120 with a second silicon oxide film 108, a silicon nitride film 106, and a first silicon oxide film 104, which are stacked in this order, interposed therebetween, and the display control transistor 534 includes such a region. In this mode, the semiconductor film 140 is a single-crystalline semiconductor film. The structure of the second silicon oxide film 108, the silicon nitride film 106, the first silicon oxide film 104, the semiconductor film 140, the gate insulating film 511, the interlayer insulating film 518, and the like is similar to that in FIG. 14B. A peripheral portion of the pixel electrode 528 is surrounded by an insulating partition layer 536. An EL layer 537 is formed over the pixel electrode 528. A counter electrode 530 is formed over the EL layer 537. The pixel portion is filled with a sealing resin 538 and is provided with a counter substrate 529 as a reinforcing plate.

In the electroluminescent display device of this mode, such pixels are arranged in a matrix to constitute a display screen. In this case, when a channel portion of a transistor of each pixel is formed using the semiconductor film 140 formed of a single-crystalline semiconductor, there are advantages in that characteristics do not vary from transistor to transistor and emission luminance does not vary from pixel to pixel. Thus, the brightness of the light-emitting element can be easily controlled with a current, and a correction circuit that corrects variation of transistor characteristics is unnecessary; therefore, a load on a driver circuit can be reduced. Further, a bottom-emission electroluminescent display device, which emits light from the supporting substrate 120 side, can be formed because a substrate which transmits light can be used for the supporting substrate 120.

As described above, a single-crystalline semiconductor film can be formed over mother glass, which is used to manufacture liquid crystal display devices or EL display devices, and a transistor can be formed using the single-crystalline semiconductor film. A transistor formed using a single-crystalline semiconductor film can be smaller because it is superior to an amorphous silicon transistor in all operating characteristics such as current drive capability. Accordingly, the aperture ratio of a pixel portion in a display panel can be increased. Further, the display device can have high reliability because a film with a high blocking property is formed between the mother glass and the single-crystalline semiconductor film. Furthermore, the display device can have a function of a computer because a microprocessor or an RFCPU as illustrated in FIG. 11 or 12 can also be formed. Furthermore, it is also possible to manufacture a display which enables input and output of data without contact.

A variety of electric devices can be formed using a substrate for manufacturing a semiconductor device according to the present invention. Examples of electric devices include a video camera, a digital camera, a navigation system, a sound reproducing device (e.g., a car audio or an audio component), a computer, a game machine, a portable information terminal (e.g., a mobile computer, a mobile phone, a mobile game machine, or an electronic book), an image reproducing device having a recording medium (specifically, a device for playing a recording medium and having a display for displaying an image therein such as a digital versatile disc (DVD)), and the like.

Figure 16A:
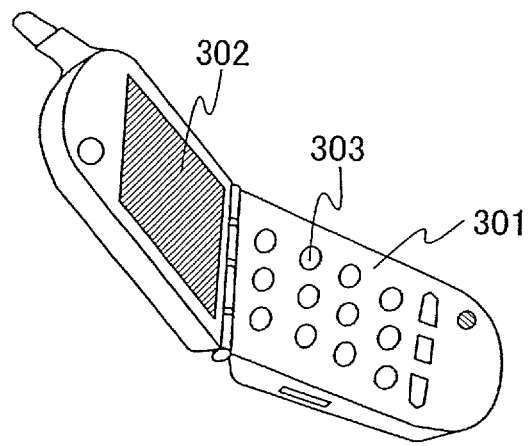
FIGS. 16A to 16C are diagrams showing examples of electric appliances.

FIG. 16A shows an example of a mobile phone. A mobile phone 301 shown in this mode includes a display portion 302, an operation switch 303, and the like. In the display portion 302, the liquid crystal display device described with reference to FIGS. 14A and 14B or the electroluminescent display device described with reference to FIGS. 15A and 15B can be used. With use of the display device of this mode, a display portion with high image quality can be formed. In addition, the semiconductor device according to the present invention can be used for a microprocessor or a memory which is included in the mobile phone 301.

Figure 16B:
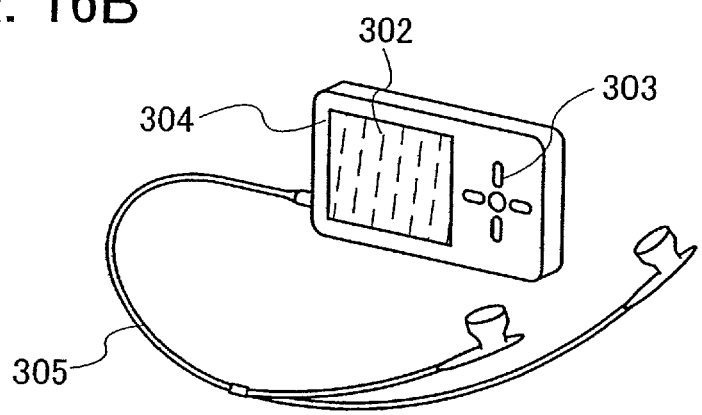

FIG. 16B shows a digital player 304, which is a typical example of an audio device. The digital player 304 shown in FIG. 16B includes a display portion 302, an operation switch 303, earphones 305, and the like. Instead of the earphones 305, headphones or wireless earphones can be used. In the digital player 304, a semiconductor device according to the present invention can be used for a memory portion which stores music information or a microprocessor which operates the digital player 304. The digital player 304 with this structure can achieve reduction in size and weight; with application of the liquid crystal display device described with reference to FIGS. 14A and 14B or the electroluminescent display device described with reference to FIGS. 15A and 15B to the display portion 302, the display portion 302 can display an image or textual information with high definition even if it has a screen size of about 0.3 to 2 inches.

Figure 16C:
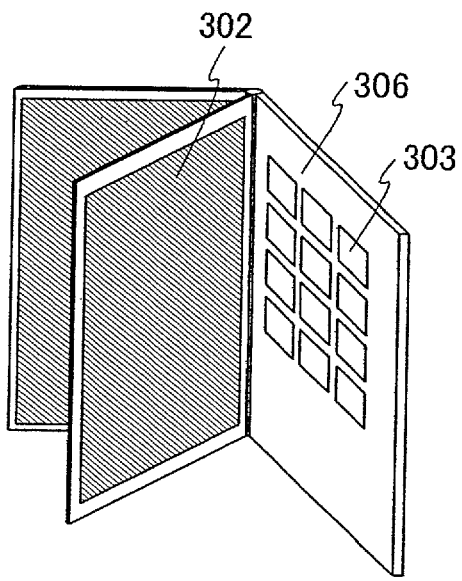

FIG. 16C shows an electronic book 306. This electronic book 306 includes a display portion 302 and an operation switch 303. A modem may be built in, or a structure with which information can be transmitted and received wirelessly may be employed. In the electronic book 306, the semiconductor device according to the present invention can be used for a memory portion which stores information or a microprocessor which operates the electronic book 306. In the memory portion, a NOR-type nonvolatile memory with a memory capacity of 20 to 200 gigabytes (GB) inclusive can be used, with which images or sounds (music) can be stored and reproduced. With application of the liquid crystal display device described with reference to FIGS. 14A and 14B or the electroluminescent display device described with reference to FIGS. 15A and 15B to the display portion 302, the display portion 302 can perform display with high image quality.

This embodiment mode can be combined as appropriate with another embodiment mode shown in this specification.

This application is based on Japanese Patent Application serial No. 2007-158286 filed with Japan Patent Office on Jun. 15, 2007, the entire contents of which are hereby incorporated by reference.

What is claimed is:

1. A substrate for manufacturing a semiconductor device, the substrate comprising:
   a single-crystalline semiconductor film fixed over a substrate having an insulating surface; and
   a barrier film over the substrate; and
   a first silicon oxide film, a first silicon nitride film, and a second silicon oxide film which are stacked in this order between the substrate having the insulating surface and the single-crystalline semiconductor film,
   wherein the first silicon nitride film contains chlorine at a concentration of $1\times10^{17}$ to $1\times10^{21}$ atoms/cm$^3$ inclusive, and
   wherein an area of the barrier film is larger than that of the first silicon oxide film, and
   wherein the barrier film is one selected from the group consisting of a second silicon nitride film, a silicon nitride oxide film, and an aluminum nitride film.

2. The substrate for manufacturing the semiconductor device according to claim 1, wherein at least one of the first silicon oxide film and the second silicon oxide film comprises nitrogen.

3. The substrate for manufacturing the semiconductor device according to claim 1, wherein the first silicon nitride film comprises oxygen.

4. The substrate for manufacturing the semiconductor device according to claim 1, wherein the substrate having the insulating surface is one selected from the group consisting of a glass substrate, a quartz substrate, a ceramic substrate, a sapphire substrate, and a metal substrate coated with an insulating film at a surface.

5. A semiconductor device comprising:
   a substrate;
   a barrier film over the substrate
   a first silicon oxide film over the barrier film;
   a first silicon nitride film over the first silicon oxide film;
   a second silicon oxide film over the first silicon nitride film; and
   a semiconductor film over the second silicon oxide film, wherein the first silicon nitride film comprises chlorine at a concentration of $1\times10^{17}$ to $1\times10^{21}$ atoms/cm$^3$ inclusive, and wherein an area of the barrier film is larger than that of the first silicon oxide film, and wherein the barrier film is one selected from the group consisting of a second silicon nitride film, a silicon nitride oxide film, and an aluminum nitride film.

6. The semiconductor device according to claim 5, wherein the substrate is one selected from the group consisting of a glass substrate, a quartz substrate, a ceramic substrate, a sapphire substrate, and a metal substrate coated with an insulating film at a surface.

7. The semiconductor device according to claim 5, wherein the semiconductor film is a single-crystalline semiconductor film.

8. The semiconductor device according to claim 5, further comprising a bonding layer between the substrate and the first silicon oxide film, wherein an area of the bonding layer is larger than that of the first silicon oxide film.

9. The semiconductor device according to claim 8, wherein the bonding layer is a third silicon oxide film.

10. A semiconductor device comprising:
a substrate;
a first silicon oxide film over the substrate;
a first silicon nitride film over the first silicon oxide film;
a second silicon oxide film over the first silicon nitride film;
an oxide film over the second silicon oxide film; and
a semiconductor film over the oxide film,
wherein the first silicon nitride film comprises chlorine at a concentration of $1\times10^{17}$ to $1\times10^{21}$ atoms/cm$^3$ inclusive, and
wherein the oxide film comprises halogen.

11. The semiconductor device according to claim 10, wherein the substrate is one selected from the group consisting of a glass substrate, a quartz substrate, a ceramic substrate, a sapphire substrate, and a metal substrate coated with an insulating film at a surface.

12. The semiconductor device according to claim 10, wherein the semiconductor film is a single-crystalline semiconductor film.

13. The semiconductor device according to claim 10, further comprising a bonding layer between the substrate and the first silicon oxide film, wherein an area of the bonding layer is larger than that of the first silicon oxide film.

14. The semiconductor device according to claim 13, wherein the bonding layer is a third silicon oxide film.

15. The semiconductor device according to claim 10, further comprising an insulating film over the semiconductor film, wherein the insulating film is in direct contact with a side surface of the second silicon oxide film.

16. The semiconductor device according to claim 10, wherein the oxide film is a third silicon oxide film.

17. A substrate for manufacturing a semiconductor device, the substrate comprising:
a single-crystalline semiconductor film fixed over a substrate having an insulating surface; and
a first silicon oxide film, a first silicon nitride film, a second silicon oxide film, and an oxide film which are stacked in this order between the substrate having the insulating surface and the single-crystalline semiconductor film,
wherein the first silicon nitride film comprises chlorine at a concentration of $1\times10^{17}$ to $1\times10^{21}$ atoms/cm$^3$ inclusive, and
wherein the oxide film comprises halogen.

18. The substrate for manufacturing the semiconductor device according to claim 17, wherein at least one of the first silicon oxide film and the second silicon oxide film comprises nitrogen.

19. The substrate for manufacturing the semiconductor device according to claim 17, wherein the first silicon nitride film comprises oxygen.

20. The substrate for manufacturing the semiconductor device according to claim 17, wherein the substrate having the insulating surface is one selected from the group consisting of a glass substrate, a quartz substrate, a ceramic substrate, a sapphire substrate, and a metal substrate coated with an insulating film at a surface.

21. The semiconductor device according to claim 17, wherein the oxide film is a third silicon oxide film.

* * * * *